(12) United States Patent
Lam et al.

(10) Patent No.: US 11,227,818 B2
(45) Date of Patent: Jan. 18, 2022

(54) STACKED DIES ELECTRICALLY CONNECTED TO A PACKAGE SUBSTRATE BY LEAD TERMINALS

(71) Applicant: UTAC Headquarters Pte. Ltd., Singapore (SG)

(72) Inventors: Wing Keung Lam, Dongguan (CN); Saravuth Sirinorakul, Bangkok (TH); Kok Chuen Lock, Dongguan (CN); Roel Adeva Robles, Singapore (SG)

(73) Assignee: UTAC Headquarters Pte. Ltd., Singapore (SG)

(*) Notice: Subject to any disclaimer, the term of this patent is extended or adjusted under 35 U.S.C. 154(b) by 0 days.

(21) Appl. No.: 16/942,715

(22) Filed: Jul. 29, 2020

(65) Prior Publication Data

US 2021/0035891 A1 Feb. 4, 2021

Related U.S. Application Data

(60) Provisional application No. 62/880,093, filed on Jul. 30, 2019.

(51) Int. Cl.
| | |
|---|---|
| *H01L 23/495* | (2006.01) |
| *H01L 23/48* | (2006.01) |
| *H01L 21/00* | (2006.01) |
| *H01R 9/00* | (2006.01) |
| *H05K 7/00* | (2006.01) |
| *H05K 7/18* | (2006.01) |
| *H01L 23/31* | (2006.01) |
| *H01L 21/56* | (2006.01) |
| *H01L 21/48* | (2006.01) |

(Continued)

(52) U.S. Cl.
CPC .... *H01L 23/49551* (2013.01); *H01L 21/4825* (2013.01); *H01L 21/56* (2013.01); *H01L 23/3107* (2013.01); *H01L 23/3121* (2013.01); *H01L 23/49517* (2013.01); *H01L 23/49541* (2013.01); *H01L 23/49575* (2013.01); *H01L 23/49838* (2013.01); *H01L 24/40* (2013.01); *H01L 24/41* (2013.01); *H01L 25/16* (2013.01); *H01L 24/06* (2013.01); *H01L 2224/04034* (2013.01); *H01L 2224/40257* (2013.01); *H01L 2924/181* (2013.01)

(58) Field of Classification Search
CPC .......... H01L 23/3107; H01L 23/49503; H01L 23/49551; H01L 23/49517; H01L 23/49575; H01L 25/16; H01L 21/4825; H01L 21/56; H01L 24/40; H01L 23/49838; H01L 24/41; H01L 24/2924; H01L 24/181; H01L 23/49541; H01L 23/3121

See application file for complete search history.

(56) References Cited

U.S. PATENT DOCUMENTS 7,569,920 B2 * 8/2009 Otremba ............... H01L 25/074
257/686
7,732,929 B2 * 6/2010 Otremba ........... H01L 23/49575
257/777

(Continued)

*Primary Examiner* — Alonzo Chambliss
(74) *Attorney, Agent, or Firm* — Horizon IP Pte Ltd.

(57) ABSTRACT

An embodiment related to a stacked package is disclosed. The stacked package includes a conductive gang with gang legs electrically coupling a second component stacked over a first die to a package substrate. The first die is mounted over a die attach region of the package substrate and electrically coupled to the package substrate.

19 Claims, 23 Drawing Sheets

(51) Int. Cl.
*H01L 25/16* (2006.01)
*H01L 23/00* (2006.01)
*H01L 23/498* (2006.01)

(56) References Cited

U.S. PATENT DOCUMENTS

| | | | |
|---|---|---|---|
| 9,312,218 B2 | 4/2016 | Choi et al. | |
| 10,456,840 B2* | 10/2019 | Conrad | B23B 5/165 |
| 2008/0006923 A1* | 1/2008 | Otremba | H01L 25/50 |
| | | | 257/686 |
| 2009/0085185 A1* | 4/2009 | Byun | H01L 25/105 |
| | | | 257/686 |
| 2012/0098090 A1* | 4/2012 | Hebert | H01L 23/49575 |
| | | | 257/532 |
| 2012/0181706 A1* | 7/2012 | Zeng | H01L 23/49562 |
| | | | 257/777 |
| 2012/0228696 A1* | 9/2012 | Carpenter | H01L 24/41 |
| | | | 257/329 |
| 2012/0248539 A1* | 10/2012 | Zhang | H01L 25/074 |
| | | | 257/368 |
| 2014/0061884 A1* | 3/2014 | Carpenter | H01L 24/37 |
| | | | 257/676 |
| 2014/0264804 A1* | 9/2014 | Terrill | H01L 24/34 |
| | | | 257/676 |
| 2014/0273344 A1* | 9/2014 | Terrill | H01L 21/4853 |
| | | | 438/107 |
| 2015/0001618 A1* | 1/2015 | Hebert | H01L 23/49568 |
| | | | 257/337 |
| 2016/0379918 A1* | 12/2016 | Xue | H01L 23/3114 |
| | | | 257/670 |

* cited by examiner

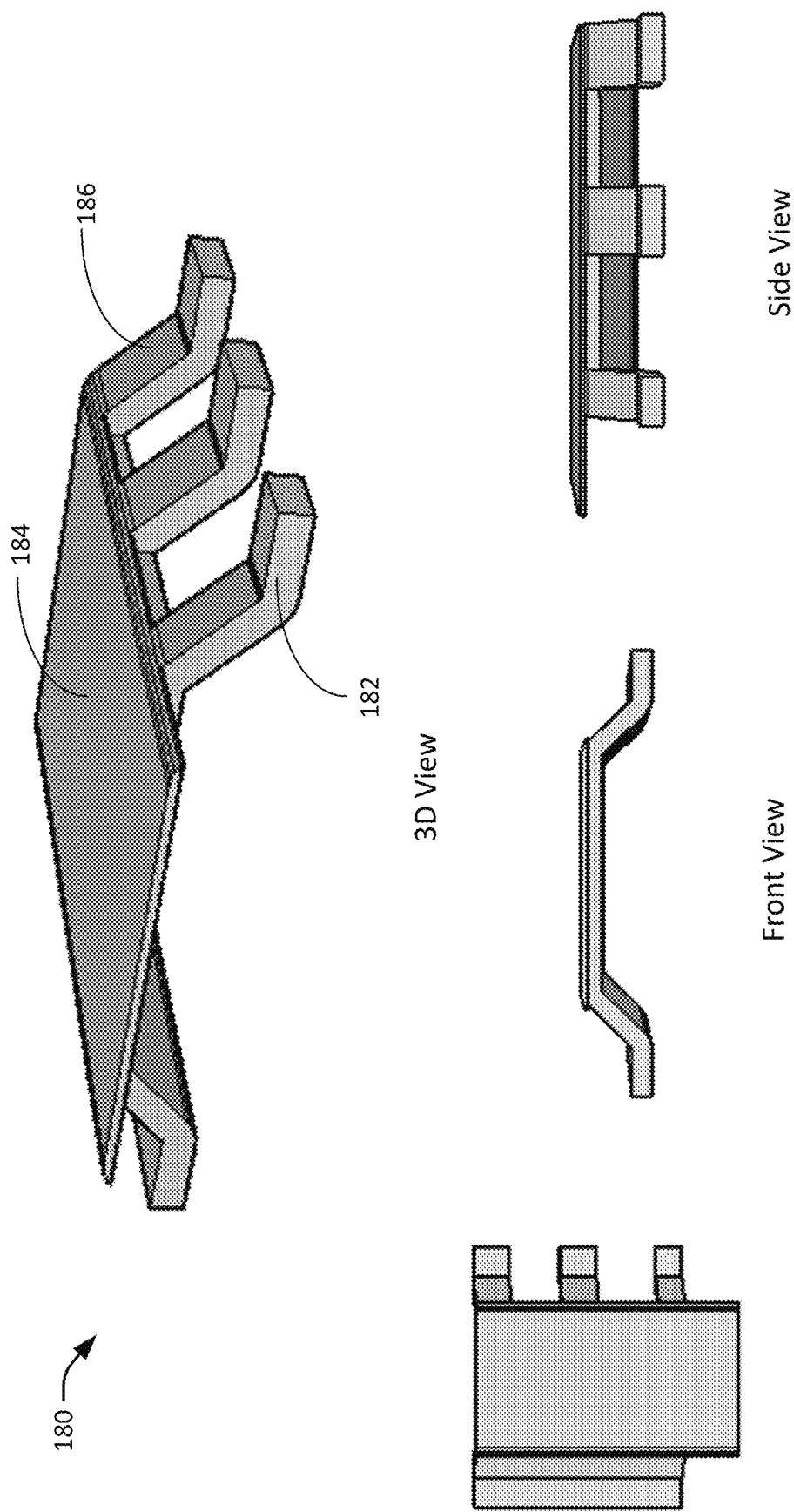

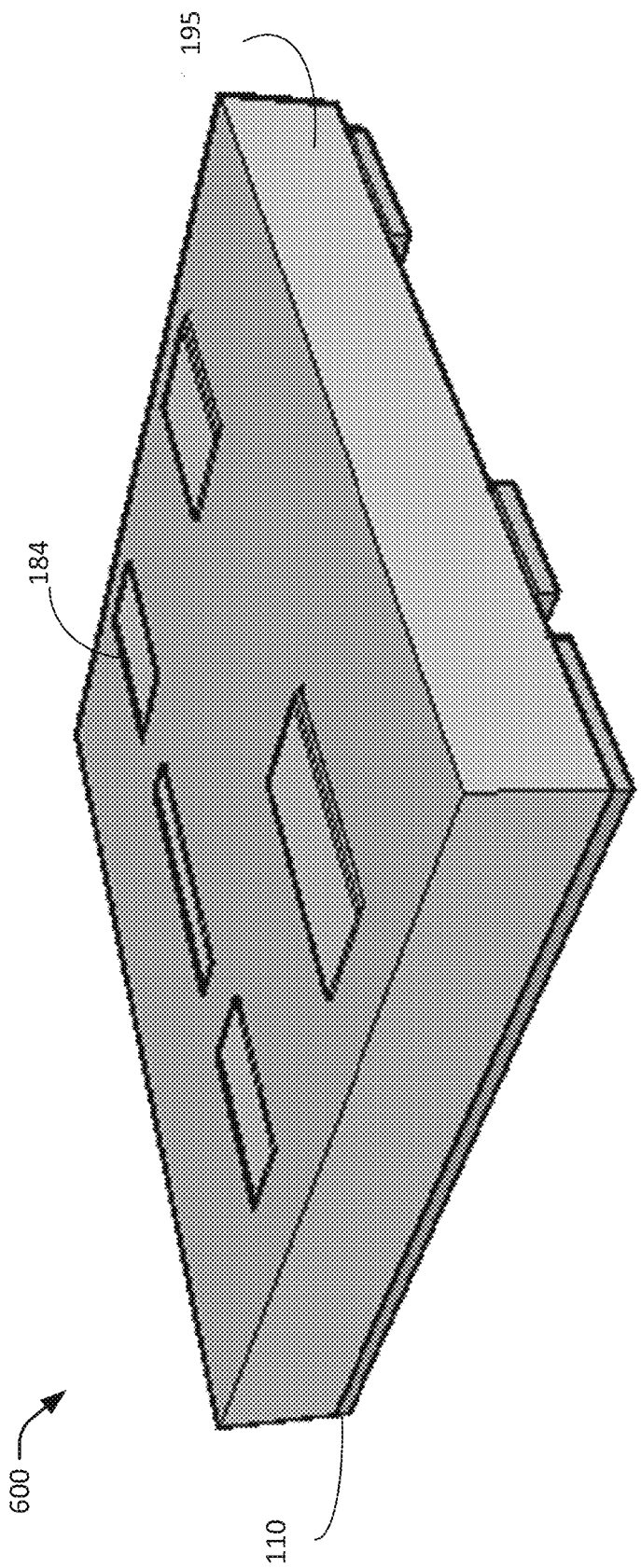

STACKED DIES ELECTRICALLY CONNECTED TO A PACKAGE SUBSTRATE BY LEAD TERMINALS

CROSS-REFERENCE TO RELATED APPLICATION

This application claims the benefit of U.S. Provisional Application Ser. No. 62/880,093, filed on Jul. 30, 2019, which is herein incorporated by reference in its entirety for all purposes.

FIELD OF THE INVENTION

The present invention generally relates to a semiconductor package. More specifically, the present invention is directed to a semiconductor package with a small footprint.

BACKGROUND

The recent rapid dissemination of smartphones and other mobile and wearable electronic terminals reflects the demand for products that are more compact and power-efficient. To meet these requirements, multi-chip packages which offer performance improvements, compactness and short time-to-market are often used.

However, multi-chip packages, particularly those with large dies or chips, such as large inductors, pose challenges. For example, mold chase must be sized to accommodate large chips, increasing manufacturing cost. In addition, multi-chip packages tend to have large footprints.

From the foregoing discussion, there is a desire to provide a stacked package with a small footprint.

SUMMARY

An embodiment related to a stacked package is disclosed. The stacked package includes a package substrate configured with a die attach region with first and second terminal pads. A first die is mounted onto the die attach region and electrically coupled to the first terminal pads. A second component is disposed over the first die. A conductive gang is disposed between the first die and second component. The conductive gang includes a patterned conductive gang with gang legs. The gang legs are configured to electrically couple the second component to the second terminal pads of the package substrate.

Another embodiment related to a method for forming a device is disclosed herein. The method includes providing a package substrate having a die attach region and attaching and electrically coupling a first die to the die attach region of the package substrate. A conductive gang with gang legs is provided over the first die. A second component is stacked over the conductive gang. The conductive gang electrically couples the second component to the package substrate.

In yet another embodiment, a stacked package disclosed herein includes a conductive gang with gang legs electrically coupling a second component stacked over a first die to a package substrate. The first die is mounted over a die attach region of the package substrate and electrically coupled to the package substrate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1b shows a 3-dimensional X-ray view of the semiconductor package of FIG. 1a;

FIG. 2b shows a 3-dimensional X-ray view of the semiconductor package of FIG. 2a;

FIGS. 4a-b show various views of different embodiments of a gang member;

FIGS. 6a-6g show perspective views of another embodiment of a process for forming a semiconductor package.

DETAILED DESCRIPTION

Embodiments relate to stacked semiconductor packages and methods for forming the stacked semiconductor packages. The stacked package, for example, includes semiconductor dies or chips such as integrated circuits (ICs). In one embodiment, the stacked package includes a chip and a component stacked over the chip to reduce the package footprint. The component may include a passive component such as a capacitor, a resistor or an inductor. In another embodiment, the stacked package includes a Package on Package (PoP), with the component on top being a package such as a wafer level chip scale package (WLCSP). Other types of packages may also be useful. In yet another embodiment, the package includes a die stack in which the dies are stacked one over another, with the component on top being another chip or die. Such packages may be incorporated into electronic products or equipment, including vehicles.

In one embodiment, a semiconductor die of the stacked package includes a substrate, such as a silicon substrate. Typically, circuit components are formed on the active surface of the substrate. The opposing substrate surface may be referred to as the inactive substrate surface. A back-end-of-line (BEOL) dielectric with interconnects is formed over the active surface of the substrate, interconnecting the circuit components. The BEOL dielectric may include multiple interconnect levels. Typically, the top surface of the BEOL dielectric includes a passivation layer with pad openings to expose die contact pads on the top interconnect level for external die connections. The top surface of the BEOL dielectric may be referred to as the active die surface and the inactive substrate surface may be referred to as the inactive die surface. In some cases, through silicon vias contacts may be provided in the substrate to provide die contact pads on the inactive die surface. In other cases, die contact pads may be provided on both the active and inactive die surfaces.

Figure 1A:
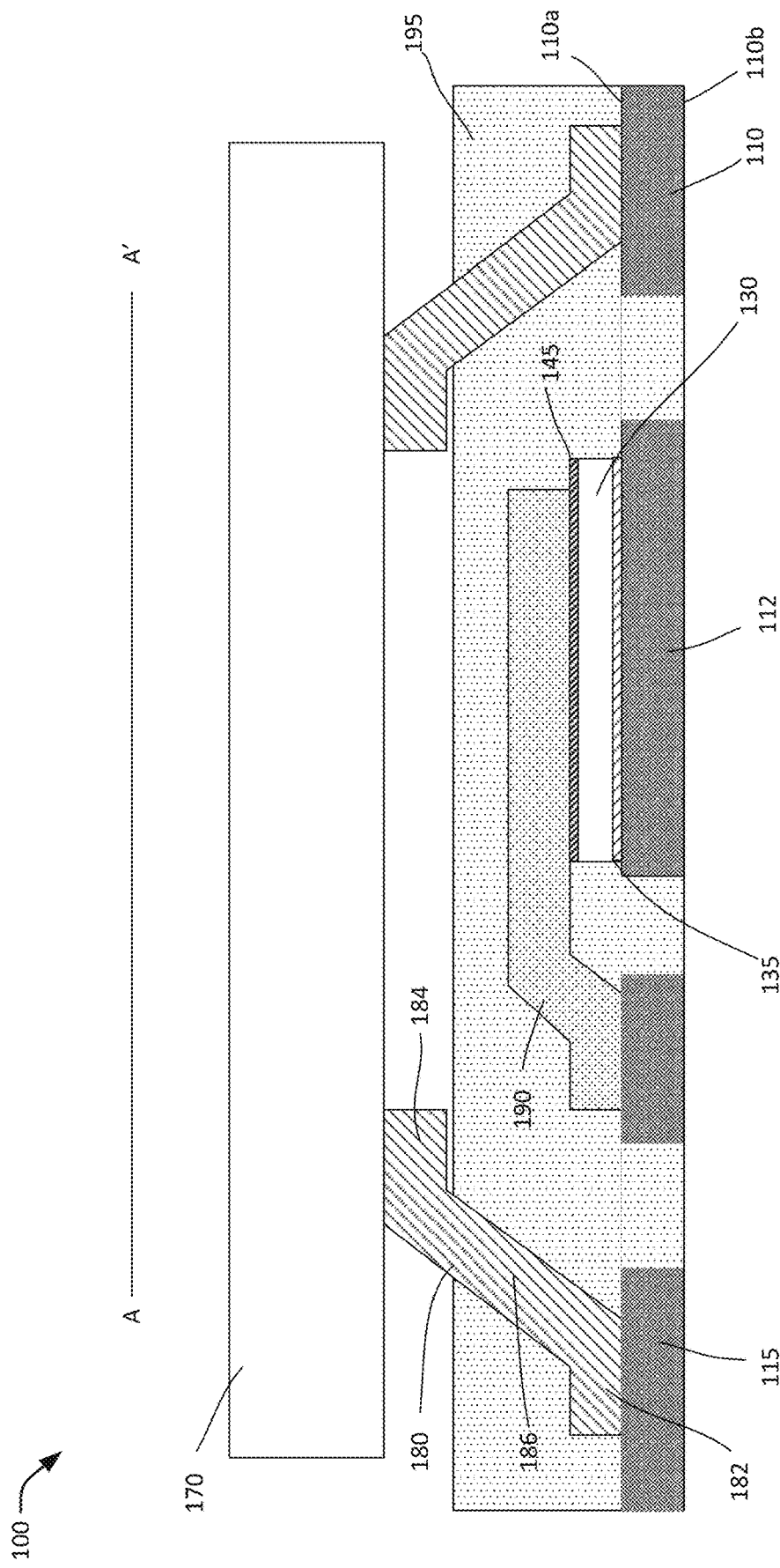
FIG. 1a shows a simplified cross-sectional view of an embodiment of a semiconductor package along A-A'.
Figure 1B:
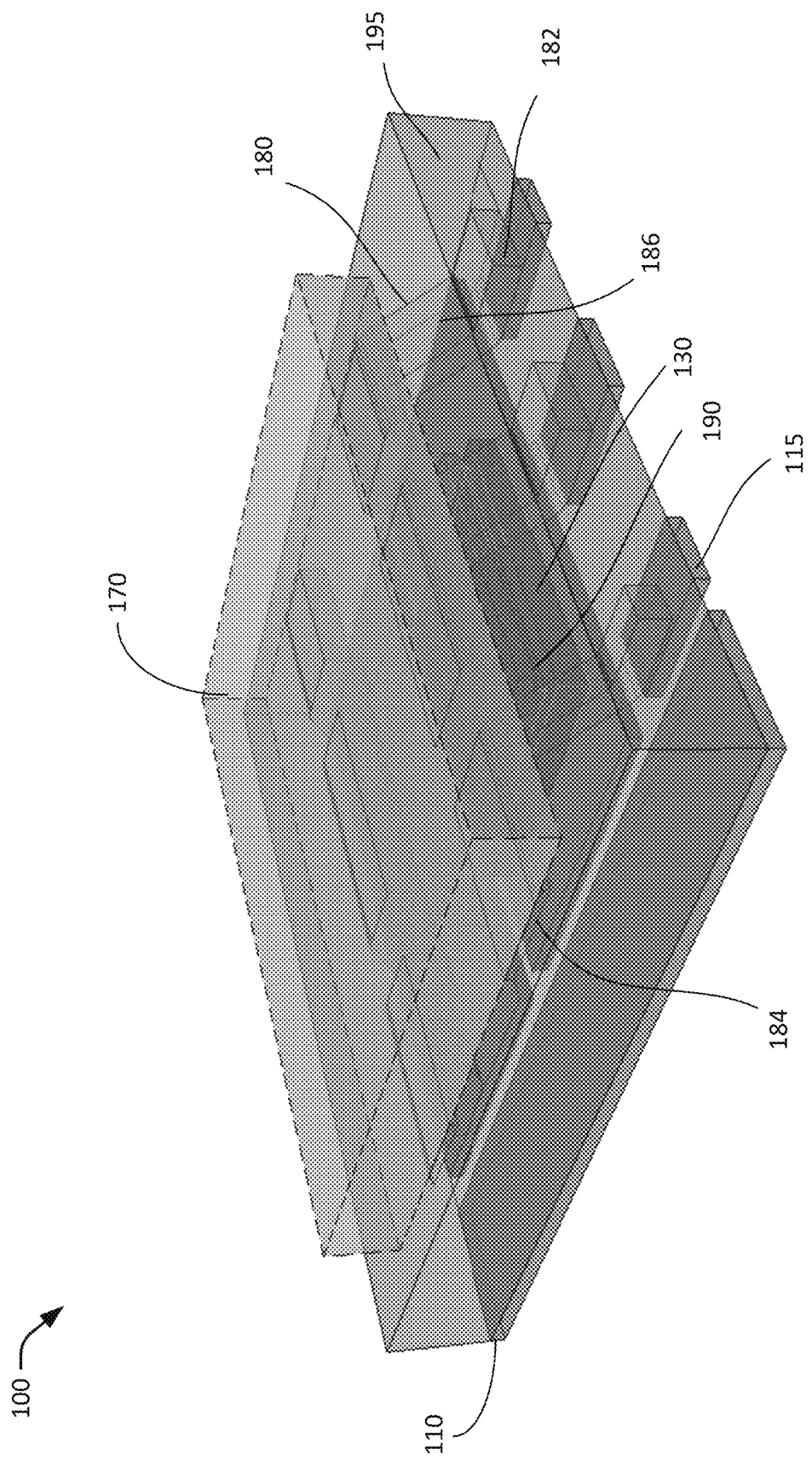

FIG. 1a shows a simplified cross-sectional view of an embodiment of a stacked semiconductor package 100 along A-A'. FIG. 1b shows a 3-dimensional X-ray view of the semiconductor package of FIG. 1a. In one embodiment, the stacked semiconductor package includes a second or top component 170 disposed over a first or bottom die 130. The second component on top may be a chip, a package or a passive component. Providing other number of stacked packages may also be useful. As shown, the semiconductor package 100 includes a package substrate 110 having first and second opposing major surfaces 110a and 110b. The first major surface 110a may be referred to as the top substrate surface and the second major surface 110b may be referred to as the bottom substrate surface. Other designations for the surfaces may also be useful.

In one embodiment, the package substrate 110 is an electrically conductive chip carrier. The conductive chip carrier may be a lead frame. The lead frame may be configured for a leadless package, such as a quad flat no-lead (QFN) package. The lead frame may also be configured for other types of packages. The package substrate or lead frame includes a die attach region 112 on which a die 130 is attached. For example, a first or bottom die of a stack is attached to the die attach region of the lead frame. In one embodiment, the die surface proximate to the lead frame may be referred to as the bottom die surface and the die surface distal from the lead frame may be referred to as the top die surface. For example, the bottom die surface of the first die is attached to the die attach region of the lead frame. The die may be attached to the die attach region by a die-substrate bonding layer 135.

The lead frame includes a plurality of terminal pads 115. The terminal pads may be arranged to surround the die attach region. Other arrangements of terminal pads may also be useful. For example, terminal pads may be disposed on two sides or three sides of the die. The number of terminal pads may depend on the package. The number, for example, may depend on the configuration of the dies/components of the stack, such as the number of terminals required by the stack. The lead frame may be formed of a conductive material, such as copper (Cu) or an alloy thereof. Other suitable metals, such as aluminum (Al), nickel (Ni), silver (Ag), gold (Au), alloys or a combination thereof, may also be used to form the lead frame. The lead frame may be part of a lead frame strip, such as a row or a matrix of lead frames. Other types of package substrates may also be useful. For example, the package substrate may include a laminated package substrate. Packages may be processed in parallel and singulated after completion. Singulation may include punching or sawing.

In one embodiment, the first die may be a power MOSFET device. For example, the power MOSFET may be a three-terminal circuit with a source terminal, a gate terminal, and a drain terminal. In such cases, the active die surface may include two die contact pads, one for the source terminal and one for the gate terminal while the inactive die surface may include a drain contact pad, which is coupled to ground. The drain contact pad may occupy most of the inactive die surface. Other types of devices or configurations of the contact pads may also be useful. Typically, the size or surface area of a contact pad correlates with the power requirement of the terminal. For example, a terminal with a higher power requirement will be larger than a terminal with a lower power requirement. In one embodiment, the top die surface is the active die surface, while the bottom die surface is the inactive die surface. The first die may be other power devices. Having other types of the first die may also be useful.

In one embodiment, the inactive die surface is attached to the die attach region. For example, the die contact pad on the bottom die surface is electrically coupled to the die attach region by a conductive die-substrate bonding layer. In one embodiment, the die-substrate bonding layer 135 includes a conductive bonding material. Preferably, the bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful.

In other embodiments, the die may be other types of die. For example, the die contact pads are provided only on the top die surface. In such cases, the die-substrate bonding layer need not be conductive. For example, the die-substrate bonding layer may be an adhesive. Various types of adhesives may be employed. For example, the adhesives may include epoxy layers which may include polymer and fillers. The adhesives may also be die-attach films or tapes. Other types of bonding layers or adhesives for attaching the die may also be useful.

A clip bond 190 is provided to electrically couple a die contact pad on the top die surface of the first die 130 to a terminal pad 115 of the package substrate 110. As shown, the clip bond is a metallic clip bond, such as a copper or copper alloy clip bond. The clip bond may be configured to have a stepped profile. For example, the clip bond includes planar upper and lower portions connected by a riser portion. As shown the riser portion is slanted at an angle between the upper and lower portions. Providing a riser portion which is vertical may also be useful. The planar upper portion is coupled to a die contact pad on the top die surface while the planar lower portion serves as a foot for connecting to a terminal pad on the lead frame. The clip bond is configured to increase the bonding surface of the terminal pad and die contact pad. Other clip bond profiles or configurations which can electrically connect a die contact pad to a terminal pad may also be useful. For example, the clip bond may be configured to include a planar upper portion and a riser portion. The base of the riser portion, for example, connects to the terminal pad. In some cases, the riser portion may be a stepped riser portion. Likewise, the upper portion may also have a stepped profile.

In one embodiment, the clip bond is formed of a conductive sheet, such as a copper or copper alloy sheet. Other types of metal sheets may also be used to form the clip bond. In an alternative embodiment, the clip bond is formed from a copper or copper alloy sheet which is plated for better compatibility with a bonding layer. The plating may also serve to reduce or minimize oxidation of the clip bond. The plating material may be silver. Other materials for plating the clip bond may also be useful. The conductive sheet may be singulated to form individual bond clips and shaped to have the desired profile, such as the stepped profile. Other profiles for the conductive sheet may also be useful. Forming the clip bond by other techniques may also be useful. For example, the clip bond may be formed by molding, stamping or from multiple parts bonded together to have the desired shape.

A conductive bonding layer 145 bonds the upper portion of the clip bond to a die contact pad on the top surface of the die 130. The bonding layer 145 may be referred to as the clip-die (clip to die) bonding layer. In one embodiment, a conductive bonding layer (not shown) bonds the lower portion of the clip bond 190 to a terminal pad of the package substrate. The conductive bonding layer may be referred to as the clip-substrate (clip to substrate) bonding layer.

In one embodiment, the clip-die and clip-substrate bonding layers are the same or similar to the die-substrate bonding layer 135. For example, the bonding layers may include a conductive material with high thermal conduction, such as a solder paste or a sintering material. Preferably, the bonding layers may be formed of the same material. For example, the bonding layers may be a solder paste or the same type of sintering material. This enables a single process for completing the bonds of the bonding layers. For example, in the case of a sintering paste, a curing process is performed while a reflow process is performed for a solder paste. For a sintering paste, a curing process may be performed in either a curing oven or a reflow oven. In some cases, different types of bonding layers may be employed. However, separate processes may be needed to complete the bonds.

Illustratively, the die is coupled to the lead frame with one clip bond. It is understood that, for example, in the case that the first die includes multiple top die contact pads, multiple clip bonds may be provided. For example, one clip bond may be provided for each top die contact pad and terminal pad pair, each bonded by a clip-die bonding layer and a clip-substrate bonding layer. The dimensions of the clip bonds as well as die contact pads may differ based on power requirements. The bonding layers should be contained within their respective contact regions to avoid shorting with other contact regions due to overflow. For example, the clip-die bonding layers should be contained within the respective clip bonds.

In some cases, the first die may include a combination of clip bonds and wire bonds for connecting the die contact pads on the top die surface to terminal pads on the lead frame. For example, one or more clip bonds and one or more wire bonds may be provided to connect the die contact pads to respective terminal pads. Other configurations of connecting the first die to the lead frame may also be useful.

The semiconductor package 100 includes a conductive gang 180. The conductive gang serves to electrically connect a component 170 disposed over the first die to the lead frame. The component, for example, is a second or top component of the stack. In one embodiment, the second component includes component contact pads on the bottom component surface. The bottom surface of the second component, for example, may be the active component surface with the component contact pads.

The conductive gang, for example, includes conductive gang legs. A gang leg serves to connect a component contact pad disposed on the bottom component surface of the second or top component of the stack. For example, the lower gang legs are coupled to terminal pads using a gang-substrate conductive bonding layers and the upper gang legs are coupled to component contact pads using gang-component conductive bonding layers. The conductive bonding layers may include a conductive bonding material. Preferably, the conductive bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful. A gang leg, as shown, may have a stepped profile, similar to the clip bond. For example, a gang leg includes upper and lower horizontal planar gang portions 184 and 182 connected by a riser gang leg portion 186. The riser gang leg portion, for example, is slanted at an angle between the upper and lower gang leg portions. Providing a riser gang leg portion which is vertical between the upper and lower gang leg portions may also be useful. In some embodiments, a gang leg may include the upper gang leg portion and the riser portion. The base of the gang leg may be connected to terminal pad. Other gang leg profiles may also be useful.

In one embodiment, the gang is patterned from a single gang member having the desired shape to form gang legs. For example, the gang member may include a main planar gang portion which serves as upper gang leg portions and gang extensions which serves as the riser and lower gang leg portions. The main planar gang portion and the extensions may be bent to shape, creating the desired profile of the gang legs. As shown, the gang member is configured to provide gang legs on opposing sides of the gang member after patterning. Other configurations of the gang member may also be useful. For example, the gang member may be configured to provide gang legs on two adjacent sides, three sides or all four sides of the main planar gang portion after patterning.

In one embodiment, an encapsulant 195 covers the first die, bond clip and the gang member except the main planar gang portion. For example, the encapsulant fills the gaps in the package substrate and covers the bottom die, bond clip and the gang member except the main planar gang portion. In the case that there are wire bonds connecting die contact pads of the bottom die and terminal pads, they are also covered.

The encapsulant, for example, may be a mold compound. The encapsulant may be formed by, for example, transfer molding, compression molding or other techniques. Other techniques for forming the encapsulant may also be useful. As shown, the encapsulant includes a planar top surface just below the main gang portion. For example, the encapsulant leaves the main planar gang portion exposed so that it can be patterned to form individual gang legs.

The encapsulant has the same footprint as the package substrate. This, for example, results from singulating the package substrate after completion of processing. As shown, the encapsulant includes substantially vertical sidewalls. This, for example, results from a saw singulation process. Alternatively, the encapsulant may be configured with sloped (or slanted) sidewalls. For example, the sidewalls of the encapsulant may slope downwardly from the planar top surface to the planar bottom surface. The sloped sidewalls of the encapsulant are, for example, formed by a punch singulation process. Other configurations of the encapsulant may also be useful.

In another embodiment, the encapsulant covers most of the gang member. In one embodiment, a top surface of the encapsulant is disposed slightly below the top surface of the main gang portion, leaving the top surface of the main gang portion exposed. By exposing the top surface of the main gang portion, the main gang portion can be patterned to form the gang legs. For example, only the surface of the main gang portion needs to be exposed. Patterning the gang member may include using an etch mask to etch or remove unprotected or exposed portions while unexposed portions are protected. The etchant may be selective to the encapsulant, removing exposed portions of the main gang portion below the surface of the encapsulant to form the gang legs. Other techniques for patterning the main gang portion to form gang legs may also be useful.

As described, the stacked package includes one component stacked over a chip. However, it is understood that other number of components and/or chips may be stacked. For example, additional gang members may be provided to connect additional components and/or dies to the package substrate. Other configurations of a stacked package may also be useful.

Figure 2A:
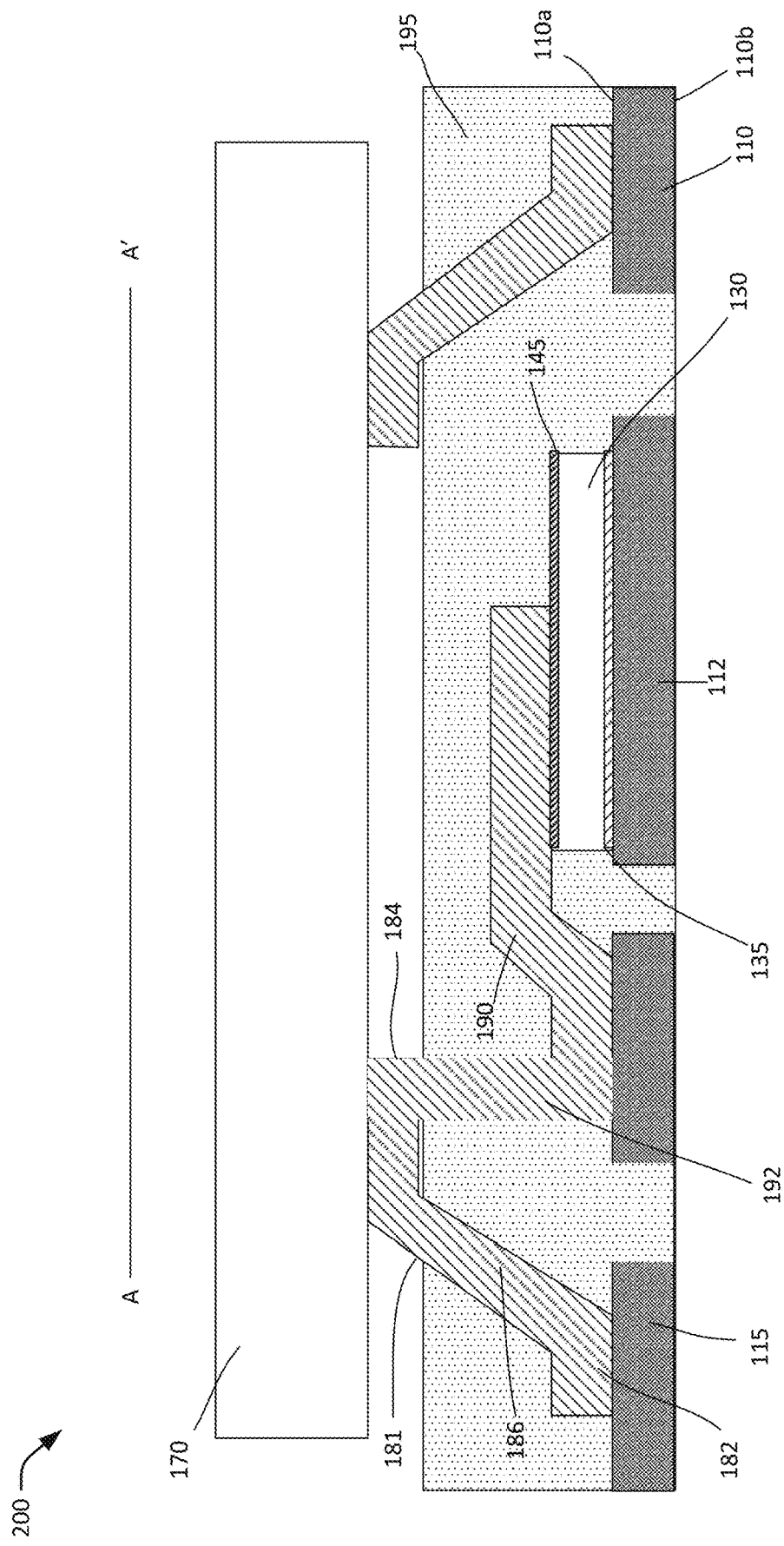
FIG. 2a shows a simplified cross-sectional view of another embodiment of a semiconductor package along A-A'.
Figure 2B:
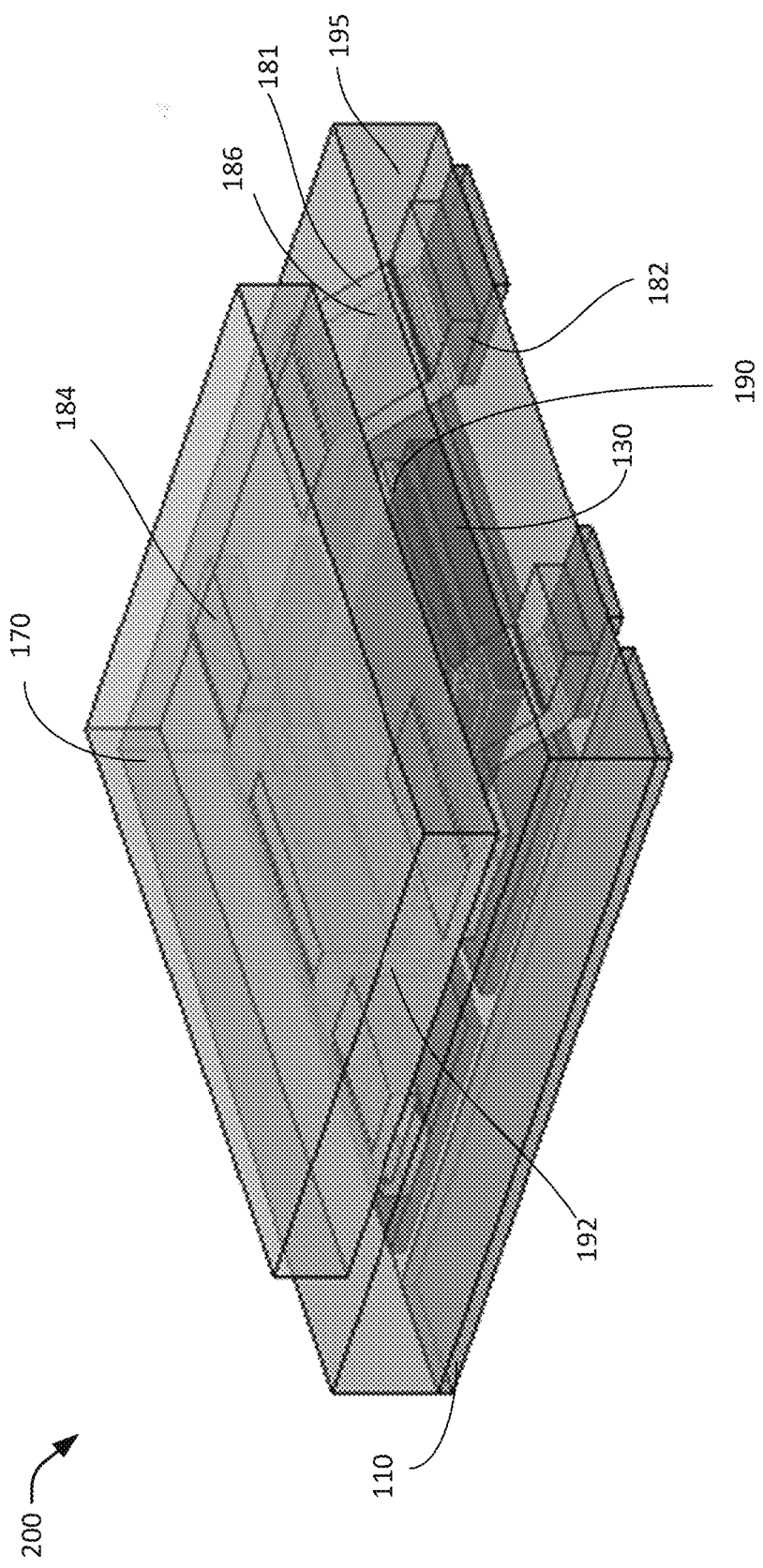

FIG. 2a shows a simplified cross-sectional view of another embodiment of a stacked semiconductor package 100 along A-A'. FIG. 2b shows a 3-dimensional X-ray view of the semiconductor package of FIG. 2a. The stacked package is similar to that described in FIGS. 1a-b. For example, the stacked semiconductor package includes a second or top component 170 disposed over a first or bottom die 130. Providing other number of stacked packages may also be useful. Common elements may not be described or described in detail.

As shown, the semiconductor package 100 includes a package substrate 110 having first and second opposing major surfaces 110a and 110b. The package substrate, for example, may be a lead frame for a leadless package. A first or bottom die 130 is attached to a die attach region 112 of the substrate. The bottom surface of the die is attached to the die attach region. The die is electrically coupled to the package substrate. For example, die contact pads on the first die are electrically connected to terminal pads 115 on the package substrate. Depending on the type of die, the die may be attached using a conductive or non-conductive die-substrate bonding layer 135. For example, in the case the die includes a die contact pad on the bottom die surface, a conductive die-substrate bonding layer is used. The conductive die-substrate bonding layer may be patterned to connect more than one die contact pad on the bottom die surface. Other configurations of the die-substrate bonding layer and die may also be useful.

In one embodiment, a gang 181 is provided to electrically connect the first die 130 and second component 170 to the package substrate. For example, the gang may be an integrated gang with gang legs and a clip bond. In some cases, depending on the number of top die contact pads on the first die, more than one clip bond may be included. The gang may be configured to include the desired number of gang legs and clip bonds based on the first die and second component. In one embodiment, the integrated gang is an integrated gang member which is patterned to provide the gang legs and clip bonds according to the first die and second component. Conductive bonding layers may be provided to electrically connect the die/component contact pads to the clip bond or gang legs as well as the clip bond and gang legs to terminal pads of the package substrate.

In one embodiment, the integrated gang is formed of a conductive sheet, such as a copper or copper alloy sheet. Other types of metal sheets may also be used to form the clip bond. In an alternative embodiment, the clip bond is formed from a copper or copper alloy sheet which is plated for better compatibility with a bonding layer. The plating may also serve to reduce or minimize oxidation of the clip bond. The plating material may be silver. Other materials for plating the clip bond may also be useful.

The conductive sheet may be singulated to form individual integrated gang members. For example, the conductive sheet may be patterned to form individual integrated gang members. Patterning, for example, may be achieved by stamping. Other techniques for patterning the conductive sheet to form integrated gang members may also be useful. An integrated gang member may include the desired pattern, which when bent to shape, attached to the lead frame and first die, and patterned, provides the clip bonds and gang legs for connecting the first die and second component to the package substrate.

As shown, the gang legs are provided on opposing sides of the lead frame. As for the clip bonds, it is provided on one side of the gang legs linked by a vertical linking portion 192. Providing a linking portion 192 which is slanted at an angle between the upper gang leg portion 184 and the lower gang leg portion 182 of the clip bond 190 may also be useful. Other configurations of the gang legs and clip bonds may also be useful.

An encapsulant 195 covers the first die and the integrated gang, except for the main gang portion. In the case that there are wire bonds connecting die contact pads of the bottom die and terminal pads, they are also covered.

Figure 3A:
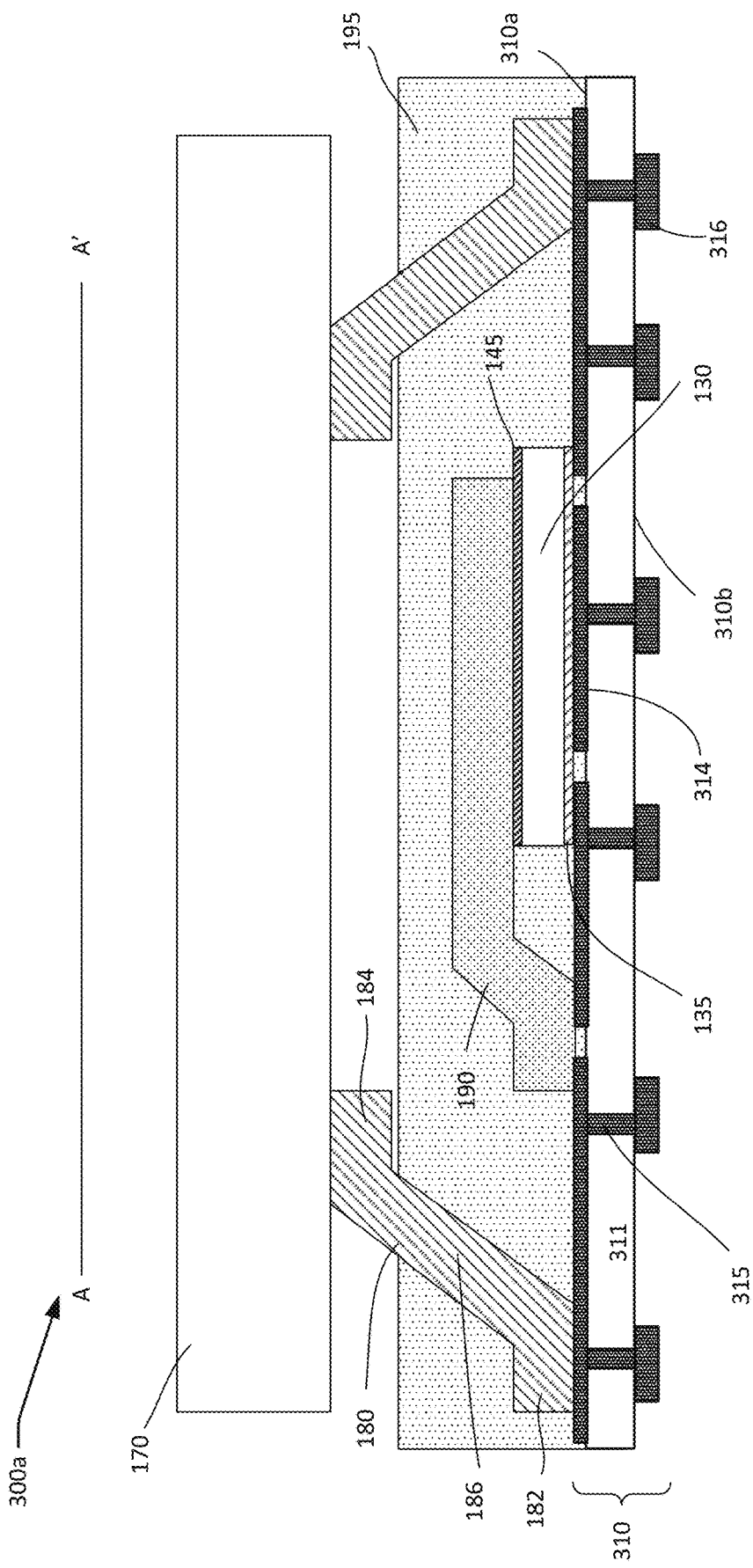
FIG. 3a shows a simplified cross-sectional view of another embodiment of a semiconductor package along A-A'.

FIG. 3a shows a simplified cross-sectional view of another embodiment of a stacked semiconductor package 300a along A-A'. The stacked package is similar to that described in FIGS. 1a-b. For example, the stacked semiconductor package includes a second or top component 170 disposed over a first or bottom die 130. Providing other configurations of stacked packages may also be useful. Common elements may not be described or described in detail.

As shown, the semiconductor package 300a includes a package substrate 310 having first and second opposing major surfaces 310a and 310b. In one embodiment, the package substrate 310 includes an interposer. In one embodiment, the interposer includes a semiconductor wafer or substrate 311, a plurality of conductive vias 315 formed through the substrate 311, and electrically conductive layers or RDLs 314 and 316 formed over the top and bottom major surfaces of the substrate 311 and coupling to the conductive vias 315. The interposer provides interconnect vertically and laterally across the interposer through the RDLs 314 and 316 and conductive vias 315 according to the electrical function of a first or bottom die 130 which mounts over a die attach region of the top major surface 310a of the interposer. The bottom surface of the first die 130 is attached to the die attach region. The die is electrically coupled to the interposer. For example, die contact pads on the first die are electrically connected to RDLs 314 and 316 and conductive vias 315 on the interposer. The RDL 316 of the interposer 310 may also serve as external connections to electrically connect one or more dies in the semiconductor package 300a to an external circuit, such as a printed circuit board (PCB).

Depending on the type of die, the die may be attached using a conductive or non-conductive die-substrate bonding layer 135. For example, in the case the die includes a die contact pad on the bottom die surface, a conductive die-substrate bonding layer is used. The conductive die-substrate bonding layer may be patterned to connect more than one die contact pad on the bottom die surface. Other configurations of the die-substrate bonding layer and die may also be useful.

In one embodiment, a clip bond 190 is provided to electrically couple a die contact pad on the top die surface of the first die 130 to the RDL 314 of the package substrate 310. Similar to the clip bond in FIGS. 1a-b, the clip bond 190 includes planar upper and lower portions connected by a riser portion. The planar upper portion is coupled to a die contact pad on the top die surface while the planar lower portion serves as a foot for connecting to the RDL 314 on the interposer. Other clip bond profiles or configurations which can electrically connect a die contact pad to the RDL may also be useful.

The first die 130 may be attached to the die attach region by a die-substrate bonding layer 135. A conductive clip-die bonding layer 145 bonds the upper portion of the clip bond to a die contact pad on the top surface of the first die 130. In one embodiment, the clip-die and clip-substrate bonding (not shown) layers are the same or similar to the die-substrate bonding layer 135. For example, the bonding layers may include a conductive material with high thermal conduction, such as a solder paste or a sintering material.

Illustratively, the die is coupled to the interposer with one clip bond. It is understood that, for example, in the case that the first die includes multiple top die contact pads, multiple clip bonds may be provided. In some cases, the first die may include a combination of clip bonds and wire bonds for connecting the die contact pads on the top die surface to RDLs on the interposer. Other configurations of connecting the first die to the interposer may also be useful.

In one embodiment, the semiconductor package 300a includes a conductive gang 180. The conductive gang serves to electrically connect a second component 170 disposed over the first die 130 to the interposer. The conductive gang, for example, includes conductive gang legs. A gang leg serves to connect a component contact pad disposed on the bottom component surface of the second or top component of the stack. For example, the lower gang legs to the RDL 314 using a gang-substrate conductive bonding layers and the upper gang legs are coupled to component contact pads using gang-component conductive bonding layers. The conductive bonding layers may be formed of conductive material. Preferably, the bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful. A gang leg, as shown, may have a stepped profile, similar to the clip bond. For example, a gang leg includes upper and lower horizontal planar gang portions 184 and 182 connected by a riser gang leg portion 186. In some embodiments, a gang leg may include the upper gang leg portion and the riser portion. The base of the gang leg may be connected to the RDL 314. Other gang leg profiles may also be useful.

In one embodiment, the gang is patterned from a single gang member having the desired shape to form gang legs. For example, the gang member may include a main planar gang portion which serves as upper gang leg portions and gang extensions which serves as the riser and lower gang leg portions. Other configurations of the gang member may also be useful. For example, the gang member may be configured to provide gang legs on two adjacent sides, three sides or all four sides of the main planar gang portion after patterning.

In one embodiment, an encapsulant 195 covers the first die, bond clip and the gang member except the main planar gang portion. For example, the encapsulant fills the gaps in the RDL 314 in the interposer and covers the bottom die, bond clip and the gang member except the main planar gang portion. In the case that there are wire bonds connecting die contact pads of the bottom die and terminal pads, they are also covered.

Figure 3B:
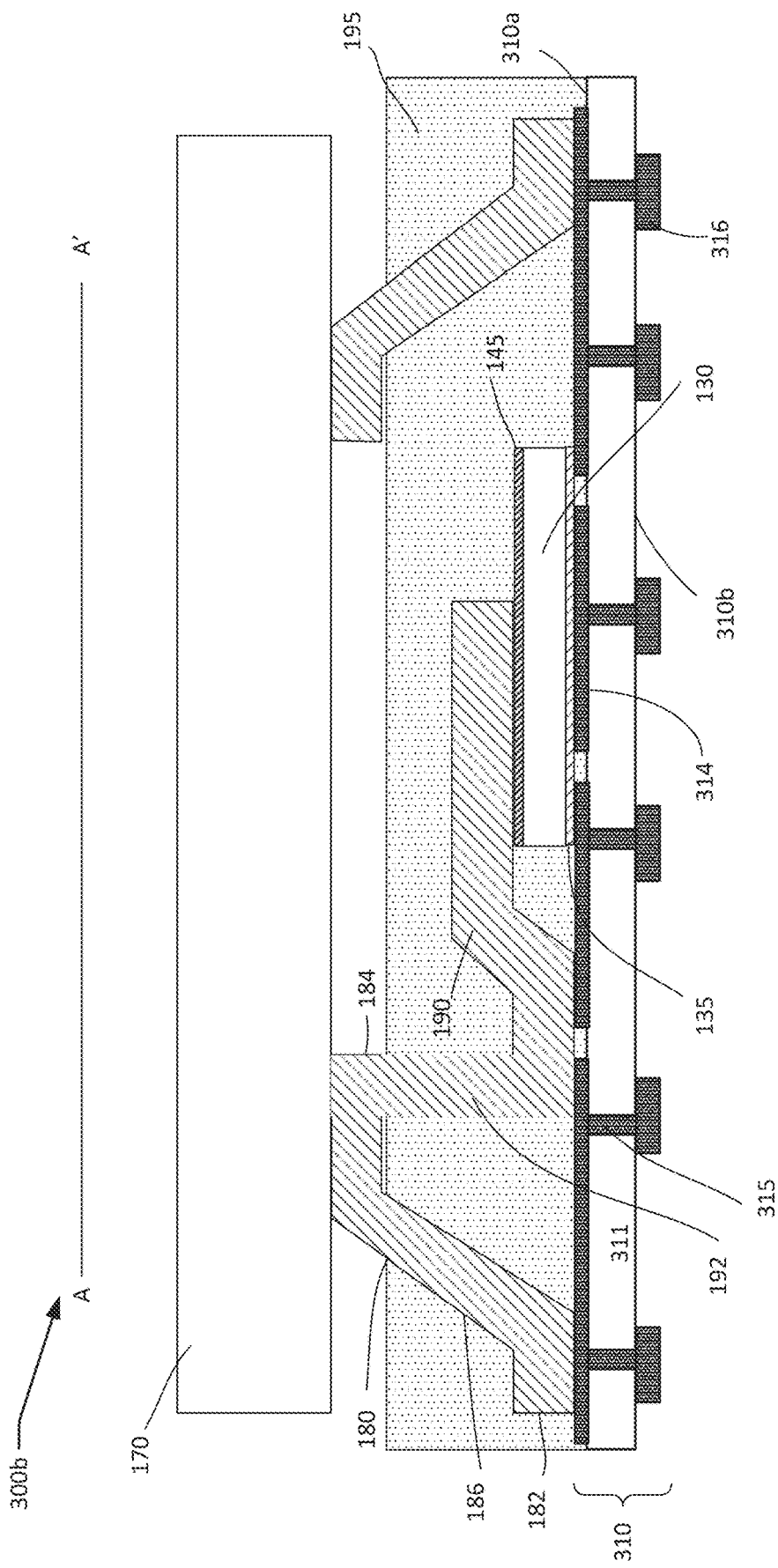
FIG. 3b shows a simplified cross-sectional view of yet another embodiment of a semiconductor package along A-A'.

FIG. 3b shows a simplified cross-sectional view of yet another embodiment of a stacked semiconductor package 300b along A-A'. In one embodiment, an integrated gang with gang legs and a clip bond similar to that shown in FIGS. 2a-b is provided to electrically connect the first die 130 and second component 170 to the package substrate. Conductive bonding layers may be provided to electrically connect the die contact pads to the clip bond or gang legs as well as the clip bond and gang legs to the RDL 314 of the package substrate.

Figure 4B:
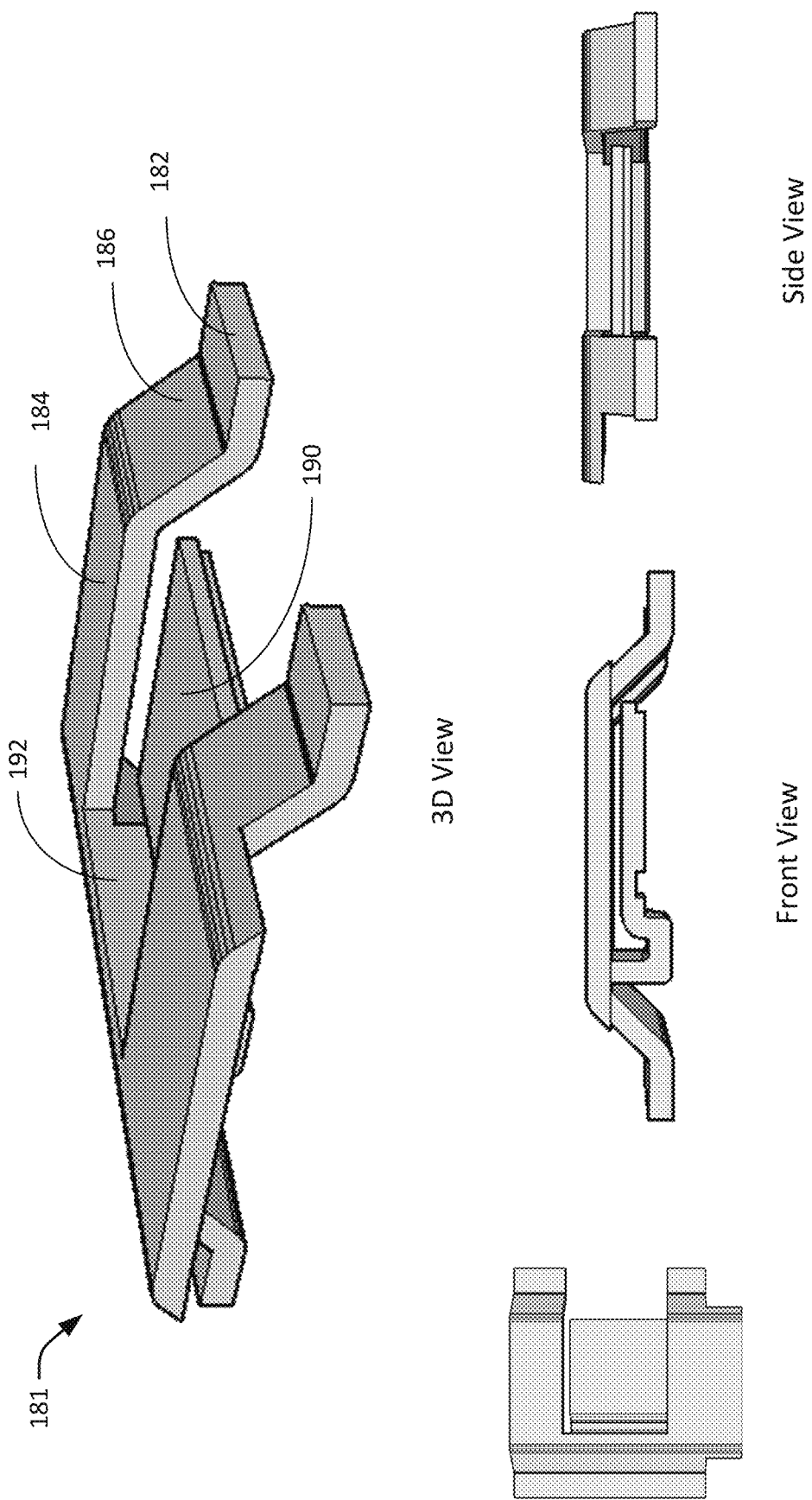

FIGS. 4a-b show various views of different embodiments of a gang member. Refer to FIG. 4a which shows various views of one embodiment of a conductive gang 180 after patterning. The conductive gang may include conductive gang legs. A gang leg, as shown, may have a stepped profile. For example, a gang leg may include upper and lower horizontal planar gang portions 184 and 182 connected by a riser gang leg portion 186. The riser gang leg portion, for example, is slanted at an angle between the upper and lower gang leg portions. Providing a gang leg riser portion which is vertical between the upper and lower gang leg portions may also be useful. In some embodiments, a gang leg may include the upper gang leg portion and the riser portion. Other gang leg profiles may also be useful.

As shown, the gang member is configured to provide gang legs on opposing sides of the gang member. Other configurations of the gang member may also be useful. For example, the gang member may be configured to provide gang legs on two adjacent sides, three sides or all four sides of the upper horizontal planar gang portion after patterning.

Refer to FIG. 4b which shows various views of one embodiment of an integrated gang 181 with gang legs and a clip bond. In some cases, depending on the number of top die contact pads on the first die, more than one clip bond may be included. The integrated gang may be configured to include the desired number of gang legs and clip bonds based on the first die and second component. In one embodiment, the integrated gang is an integrated gang member which is patterned to provide the gang legs and clip bonds according to the first die and second component.

As shown, the gang legs are provided on opposing sides of the integrated gang 181. As for the clip bonds, it is provided on one side of the gang legs linked by a vertical linking portion 192. Providing a linking portion 192 which is slanted at an angle between the upper gang leg portion 184 and the lower gang leg portion 182 of the clip bond 190 may also be useful. Providing a vertical linking portion 192 may also be useful. Other configurations of the gang legs and clip bonds may also be useful.

Advantageously, having stacked chips/components with vertical interconnect provided by a gang between the stacked chips/components and the package substrate may reduce the footprint of the semiconductor package. In addition, by stacking the chips/components, cost savings on additional molding tools to accommodate a large sized stacked chip/component may be achieved. Further, providing the integrated gang member may increase productivity, because process steps may be reduced.

Figure 5A:
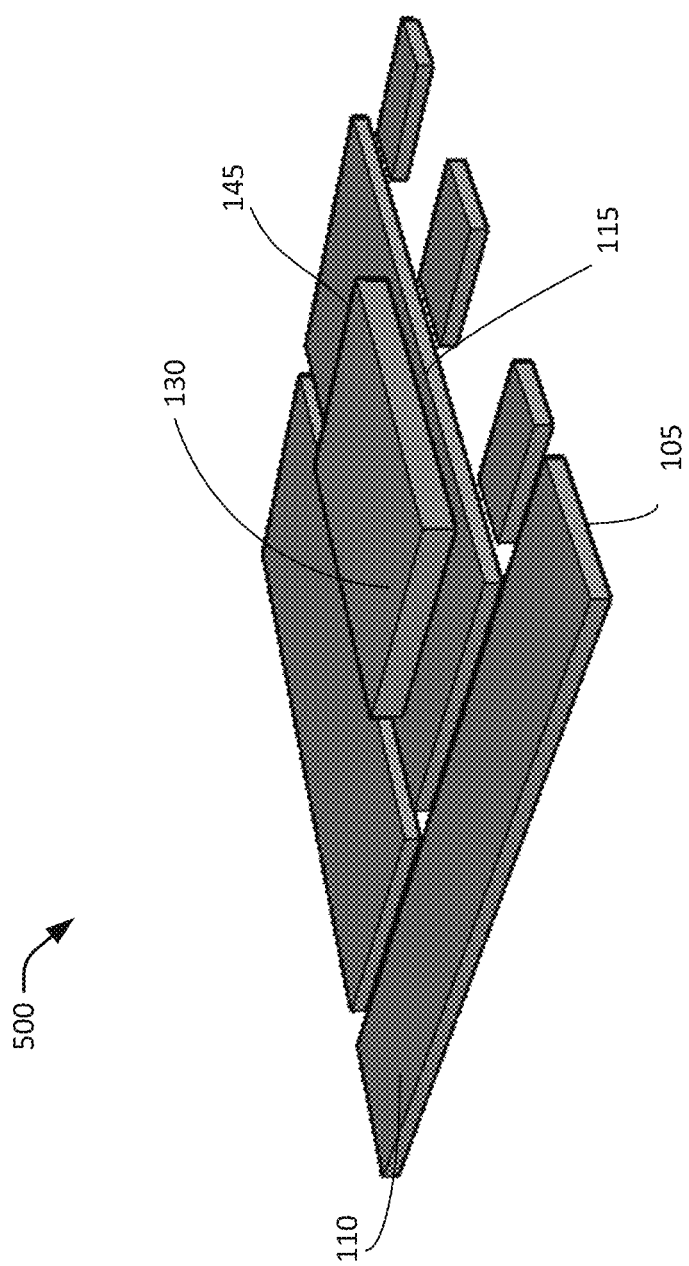
FIGS. 5a-5h show perspective views of an embodiment of a process for forming a semiconductor package.

FIGS. 5a-5h show perspective views of an embodiment of a process for forming a semiconductor package 500 similar to the one illustrated in FIGS. 1a-b. Referring to FIG. 5a, the process 500 begins by providing a package substrate 110. The package substrate includes opposing top and bottom substrate surfaces 110a and 110b. The package substrate serves as an electrically conductive chip carrier for the package. The conductive chip carrier may be a lead frame. The lead frame may be configured for a leadless package, such as a QFN package. The lead frame may also be configured for other types of packages.

In one embodiment, the package substrate 110 includes a lead frame configured with a plurality of conductive pads 115. The bottom major surface of the package substrate 110 is attached to an adhesive tape 105 which provides the package substrate with sufficient mechanical support for further processing steps.

The package substrate or lead frame includes a die attach region 112 on which a die is attached. For example, a first or bottom die 130 of a stack is attached to the die attach region 112 of the lead frame. In one embodiment, the bottom die surface of the first die is attached to the die attach region of the lead frame. The die may be attached to the die attach region by a die-substrate bonding layer 135.

The lead frame includes a plurality of terminal pads 115. The terminal pads may be arranged to surround the die attach region. Other arrangements of terminal pads may also be useful. For example, terminal pads may be disposed on two sides or three sides of the die. The number of terminal pads may depend on the package. The number, for example, may depend on the configuration of the dies/components of the stack, such as the number of terminals required by the stack. The lead frame may be formed of a conductive material, such as copper (Cu) or an alloy thereof. Other suitable metals, such as aluminum (Al), nickel (Ni), silver (Ag), gold (Au), alloys or a combination thereof, may also be used to form the lead frame. The lead frame may be part of a lead frame strip, such as a row or a matrix of lead frames. Other types of package substrates may also be useful. For example, the package substrate may include a laminated package substrate. Packages may be processed in parallel and singulated after completion. Singulation may include punching or sawing.

In one embodiment, the first die 130 may be a power MOSFET device. In one embodiment, the top die surface is the active die surface, while the bottom die surface is the inactive die surface. In one embodiment, the inactive die surface is attached to the die attach region 112. For example, the die contact pad on the bottom die surface is electrically coupled to the die attach region by a conductive die-substrate bonding layer 135. In one embodiment, the die-substrate bonding layer 135 includes a conductive bonding material. Preferably, the bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful.

In other embodiments, the die may be other types of die. For example, the die contact pads are provided only on the top die surface. In such cases, the die-substrate bonding layer need not be conductive. For example, the die-substrate bonding layer may be an adhesive. Various types of adhesives may be employed. For example, the adhesives may include epoxy layers which may include polymer and fillers. The adhesives may also be die-attach films or tapes. Other types of bonding layers or adhesives for attaching the die may also be useful.

In one embodiment, a conductive bonding layer 145 is disposed over the die contact pad on the top surface of the die 130. The bonding layer 145 may be referred to as the clip-die bonding layer.

Figure 5B:
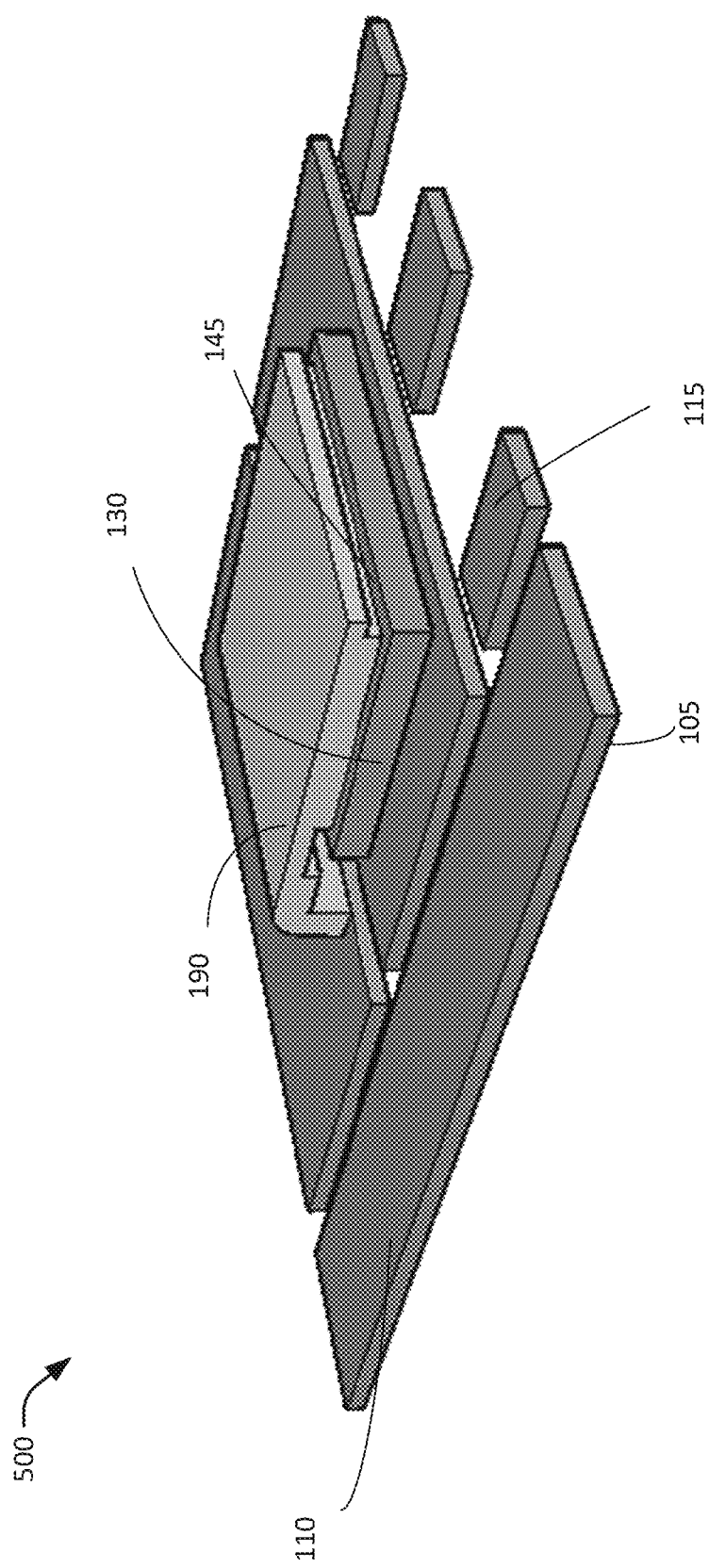

Refer to FIG. 5b, a clip bond 190 is provided to electrically couple a die contact pad on the top die surface of the first die 130 to a terminal pad 115 of the package substrate 110. The clip-die bonding layer 135 bonds the upper portion of the clip bond to the die contact pad on the top surface of the die 130.

In one embodiment, the clip bond is a metallic clip bond, such as a copper or copper alloy clip bond. The clip bond may be configured to have a stepped profile. For example, the clip bond includes planar upper and lower portions connected by a riser portion. As shown the riser portion is slanted at an angle between the upper and lower portions. Providing a riser portion which is vertical may also be useful. The planar upper portion is coupled to a die contact pad on the top die surface while the planar lower portion serves as a foot for connecting to a terminal pad on the lead frame. Other clip bond profiles or configurations which can electrically connect a die contact pad to a terminal pad may also be useful. For example, the clip bond may be configured to include a planar upper portion and a riser portion. The base of the riser portion, for example, connects to the terminal pad. In some cases, the riser portion may be a stepped riser portion. Likewise, the upper portion may also have a stepped profile.

In one embodiment, the clip bond is formed of a conductive sheet, such as a copper or copper alloy sheet. Other types of metal sheets may also be used to form the clip bond. In an alternative embodiment, the clip bond is formed from a copper or copper alloy sheet which is plated for better compatibility with a bonding layer. The plating may also serve to reduce or minimize oxidation of the clip bond. The plating material may be silver. Other materials for plating the clip bond may also be useful. The conductive sheet may be singulated to form individual bond clips and shaped to have the desired profile, such as the stepped profile. Other profiles for the conductive sheet may also be useful. Forming the clip bond by other techniques may also be useful. For example, the clip bond may be formed by molding, stamping or from multiple parts bonded together to have the desired shape.

In one embodiment, a conductive clip-substrate bonding layer (not shown) bonds the lower portion of the clip bond 190 to a terminal pad of the package substrate. In one embodiment, the clip-die and clip-substrate bonding layers are the same or similar to the die-substrate bonding layer 135. For example, the bonding layers may include a conductive material with high thermal conduction, such as a solder paste or a sintering material. Preferably, the bonding layers may be formed of the same material. For example, the bonding layers may be a solder paste or the same type of sintering material. This enables a single process for completing the bonds of the bonding layers. For example, in the case of a sintering paste, a curing process is performed while a reflow process is performed for a solder paste. For a sintering paste, a curing process may be performed in either a curing oven or a reflow oven. In some cases, different types of bonding layers may be employed. However, separate processes may be needed to complete the bonds.

Illustratively, the die is coupled to the lead frame with one clip bond. It is understood that, for example, in the case that the first die includes multiple top die contact pads, multiple clip bonds may be provided. For example, one clip bond may be provided for each top die contact pad and terminal pad pair, each bonded by a clip-die bonding layer and a clip-substrate bonding layer. The dimensions of the clip bonds as well as die contact pads may differ based on power requirements. The bonding layers should be contained within their respective contact regions to avoid shorting with other contact regions due to overflow. For example, the clip-die bonding layers should be contained within the respective clip bonds.

In some cases, the first die may include a combination of clip bonds and wire bonds for connecting the die contact pads on the top die surface to terminal pads on the lead frame. For example, one or more clip bonds and one or more wire bonds may be provided to connect the die contact pads to respective terminal pads. Other configurations of connecting the first die to the lead frame may also be useful.

Figure 5C:
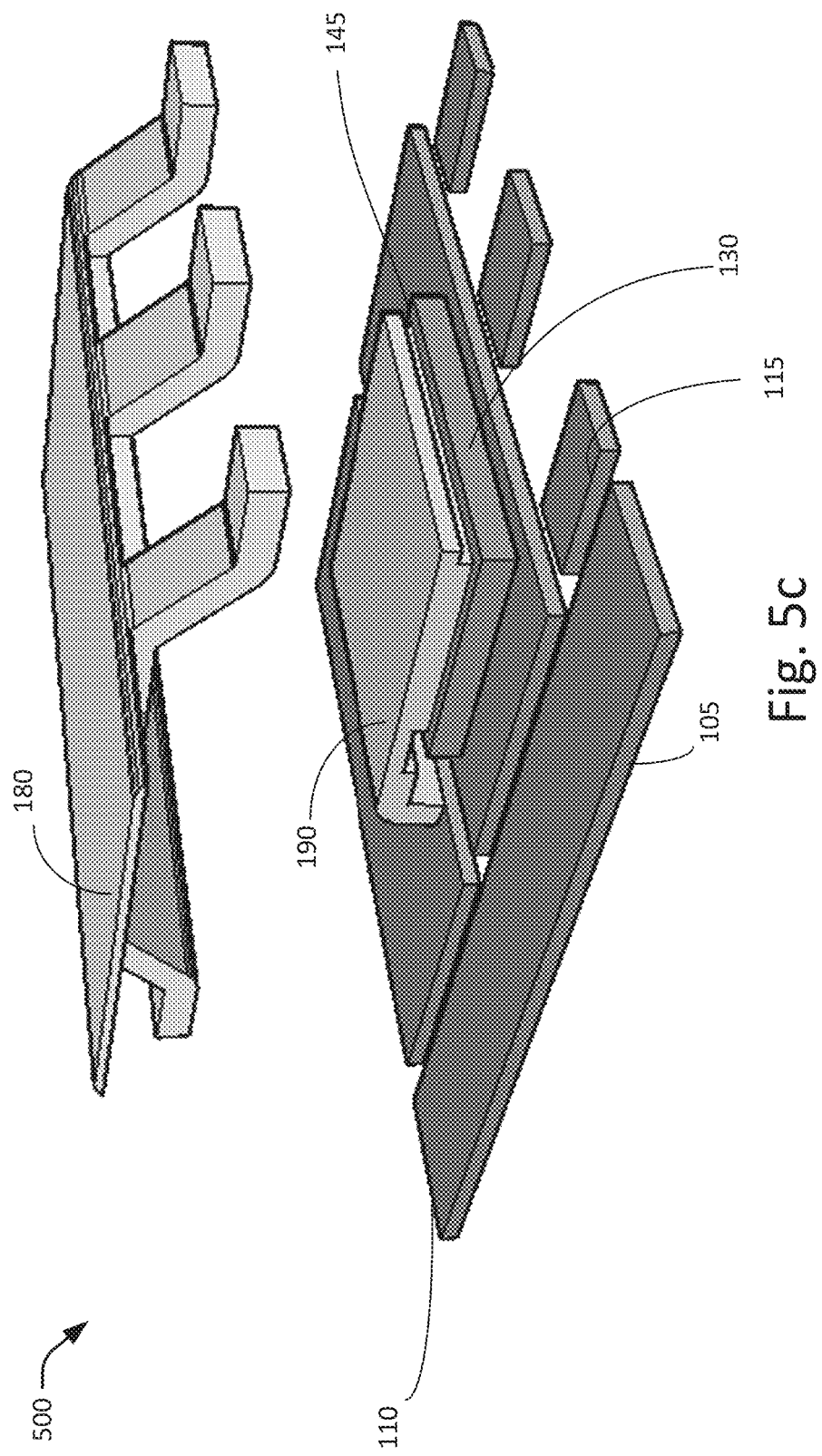

FIG. 5c shows disposing a conductive gang 180 over the lead frame 110, first die 130 and clip bond 190. The conductive gang serves to electrically connect a die subsequently disposed over the first die to the lead frame.

The conductive gang 180, for example, includes conductive gang legs. A gang leg, as shown, may have a stepped profile, similar to the clip bond. For example, a gang leg includes upper and lower horizontal planar gang portions 184 and 182 connected by a riser gang leg portion 186. The riser gang leg portion, for example, is slanted at an angle between the upper and lower gang leg portions. Providing a riser gang leg portion which is vertical between the upper and lower gang leg portions may also be useful. In some embodiments, a gang leg may include the upper gang leg portion and the riser portion. The base of the gang leg may be connected to terminal pad. Other gang leg profiles may also be useful.

In one embodiment, the gang is patterned from a single gang member having the desired shape to form gang legs. For example, the gang member may include a main planar gang portion which serves as upper gang leg portions and gang extensions which serves as the riser and lower gang leg portions. The main planar gang portion and the extensions may be bent to shape, creating the desired profile of the gang legs. As shown, the gang member is configured to provide gang legs on opposing sides of the gang member after patterning. Other configurations of the gang member may also be useful. For example, the gang member may be configured to provide gang legs on two adjacent sides, three sides or all four sides of the main planar gang portion after patterning.

Figure 5D:
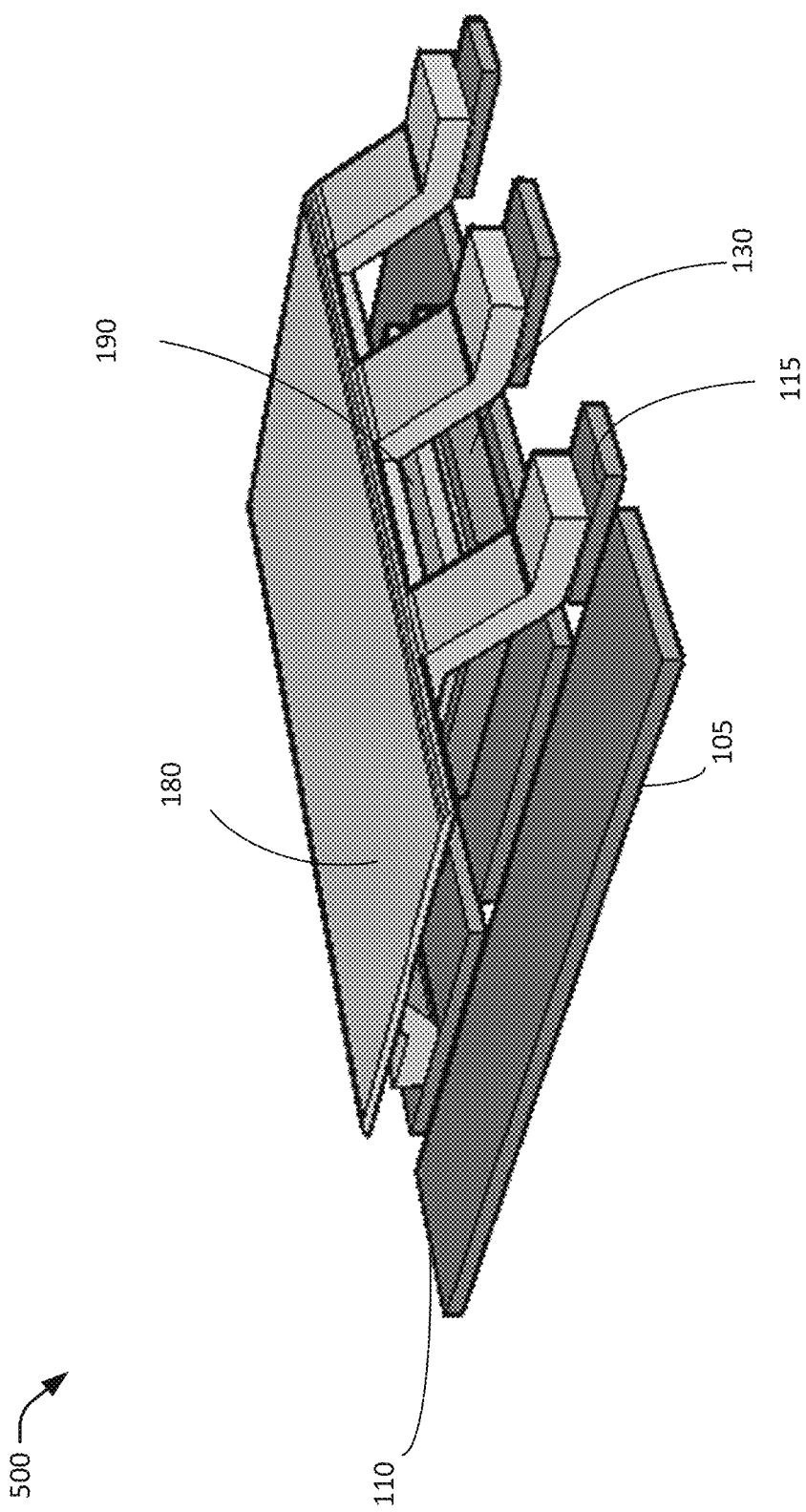

In one embodiment, as shown in FIG. 5d, the lower gang legs are bonded to terminal pads using a gang-substrate conductive bonding layers (not shown).

Figure 5E:
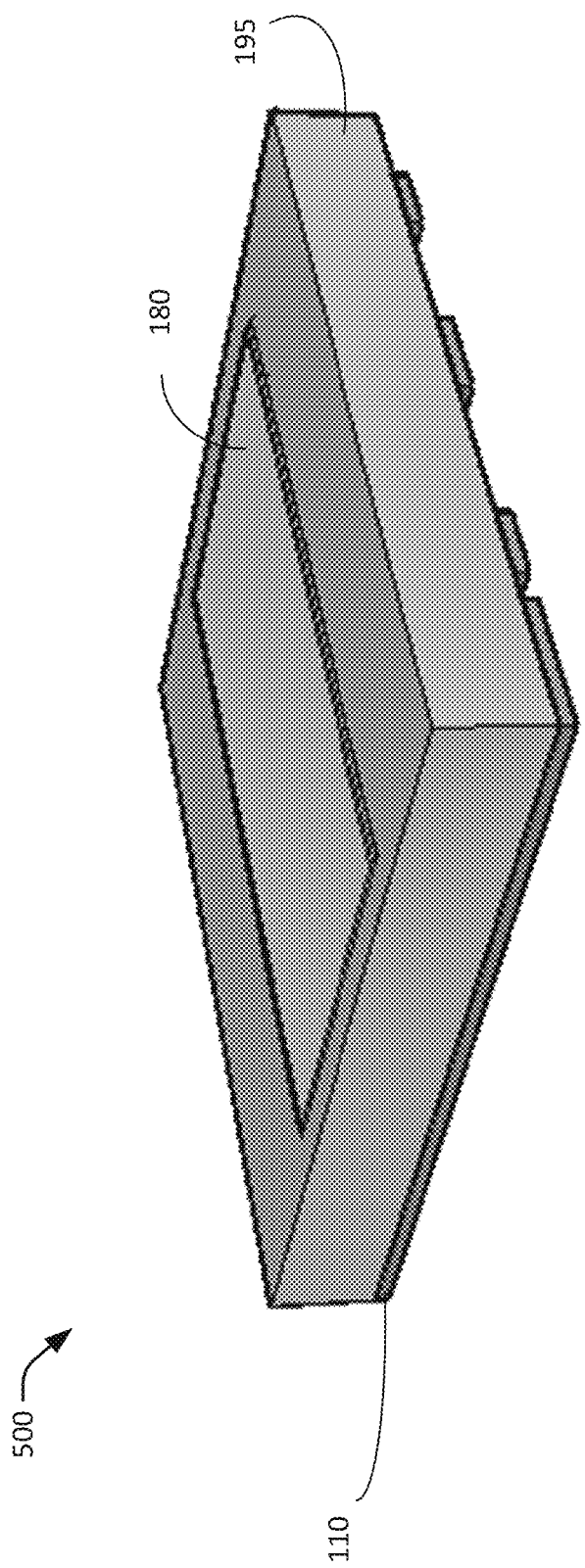

As shown in FIG. 5e, an encapsulant 195 may be disposed to cover the first die, bond clip and the gang member 180 except the surface of the main planar gang portion. For example, the encapsulant fills the gaps in the package substrate and covers the bottom die, bond clip and the gang member except the top surface of the main planar gang portion. In another embodiment, the encapsulant includes a major top surface which is disposed below the bottom surface of the main gang portion. In the case that there are wire bonds connecting die contact pads of the bottom die and terminal pads, they are also covered. After the formation of the encapsulant, the adhesive tape 105 is removed.

The encapsulant, for example, may be a mold compound. The encapsulant may be formed by, for example, transfer molding, compression molding or other techniques. Other techniques for forming the encapsulant may also be useful.

The encapsulant has the same footprint as the package substrate. This, for example, results from singulating the package substrate after completion of processing. As shown, the encapsulant includes substantially vertical sidewalls. This, for example, results from a saw singulation process. Alternatively, the encapsulant may be configured with sloped (or slanted) sidewalls. For example, the sidewalls of the encapsulant may slope downwardly from the planar top surface to the planar bottom surface. The sloped sidewalls of the encapsulant are, for example, formed by a punch singulation process. Other configurations of the encapsulant may also be useful.

Figure 5F:
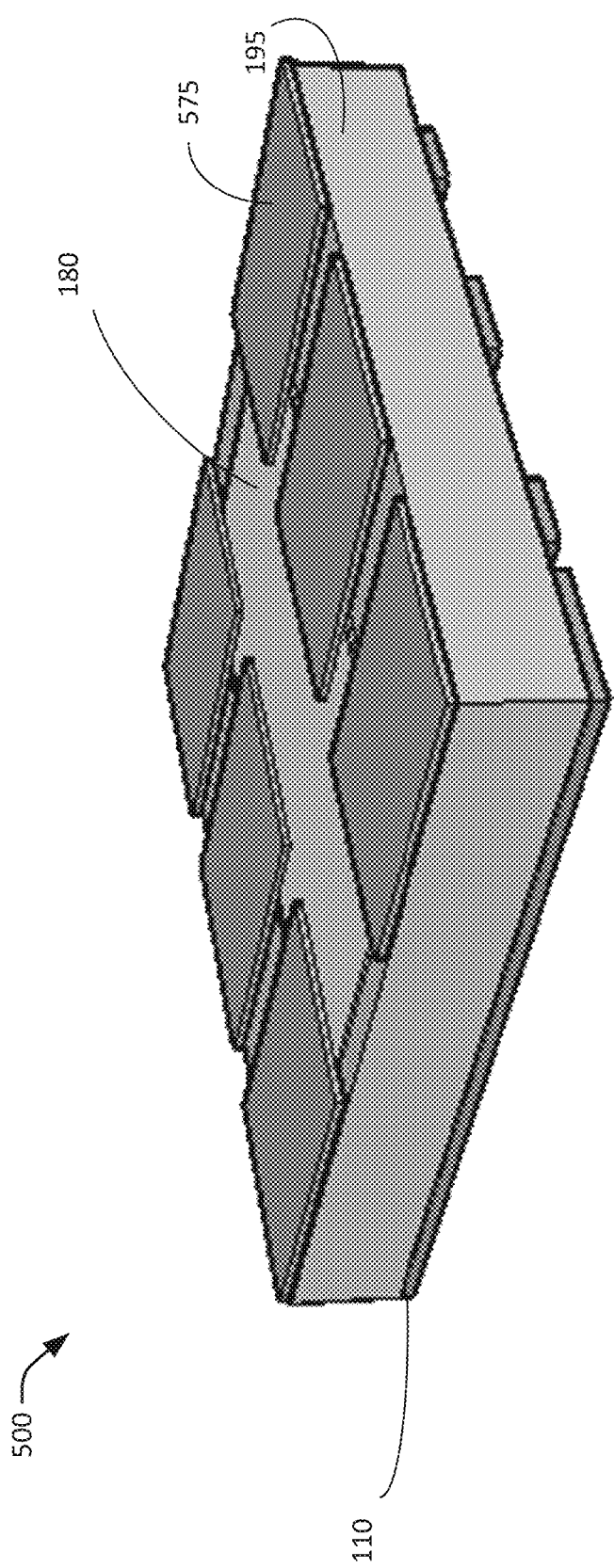
Figure 5G:
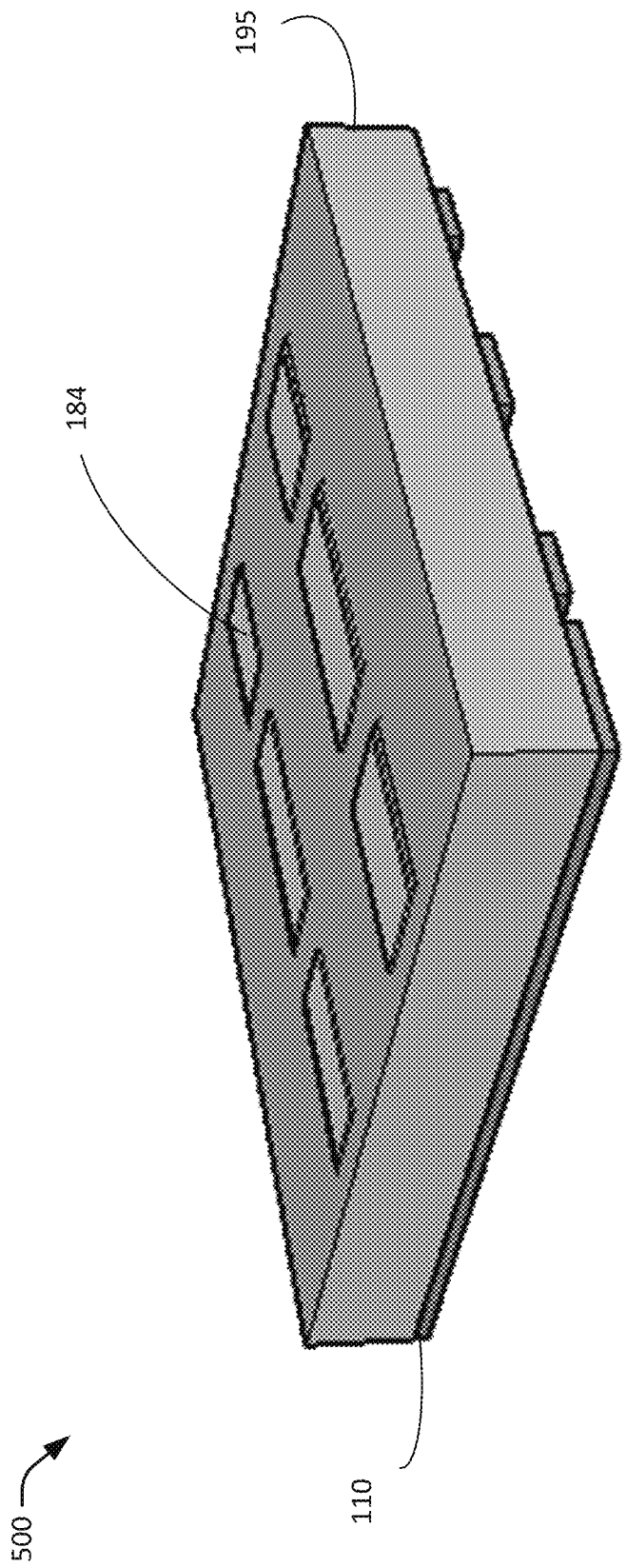

Referring to FIG. 5f, a patterned mask layer 575, such as a photoresist, may be disposed on the main planar gang portion of the gang 180. As shown in FIG. 5g, an etch process may be performed using the patterned mask layer 575 as an etch mask to remove portions of the main planar gang portion exposed by the etch mask. The etch, in one embodiment, may be an anisotropic etch such as a plasma etch. Other suitable techniques may also be employed. The etch, for example, removes portions of the main planar gang portion below the surface of the encapsulant. In one embodiment, the main planar gang portion of the gang 180 may be patterned to form upper gang leg portions 184 corresponding to patterns of die contact pads disposed on an active surface of a second component to be mounted thereover. For example, an overetch may be performed to ensure the gang leg portions are isolated from one another.

In another embodiment, as previously discussed, the encapsulant may be disposed below the bottom surface of the main gang portion. An etch using an etchant may be employed to pattern the main gang portion to form gang leg portions.

The process continues by depositing a gang-component conductive bonding layer (not shown) over the upper gang leg portions 184 of the gang 180. The gang-component bonding layer may be formed of conductive material. Preferably, the bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful. The bonding layer may be formed by employing techniques such as plating, screen printing with a stencil and/or mask, dispensing. Other techniques may also be useful.

Figure 5H:
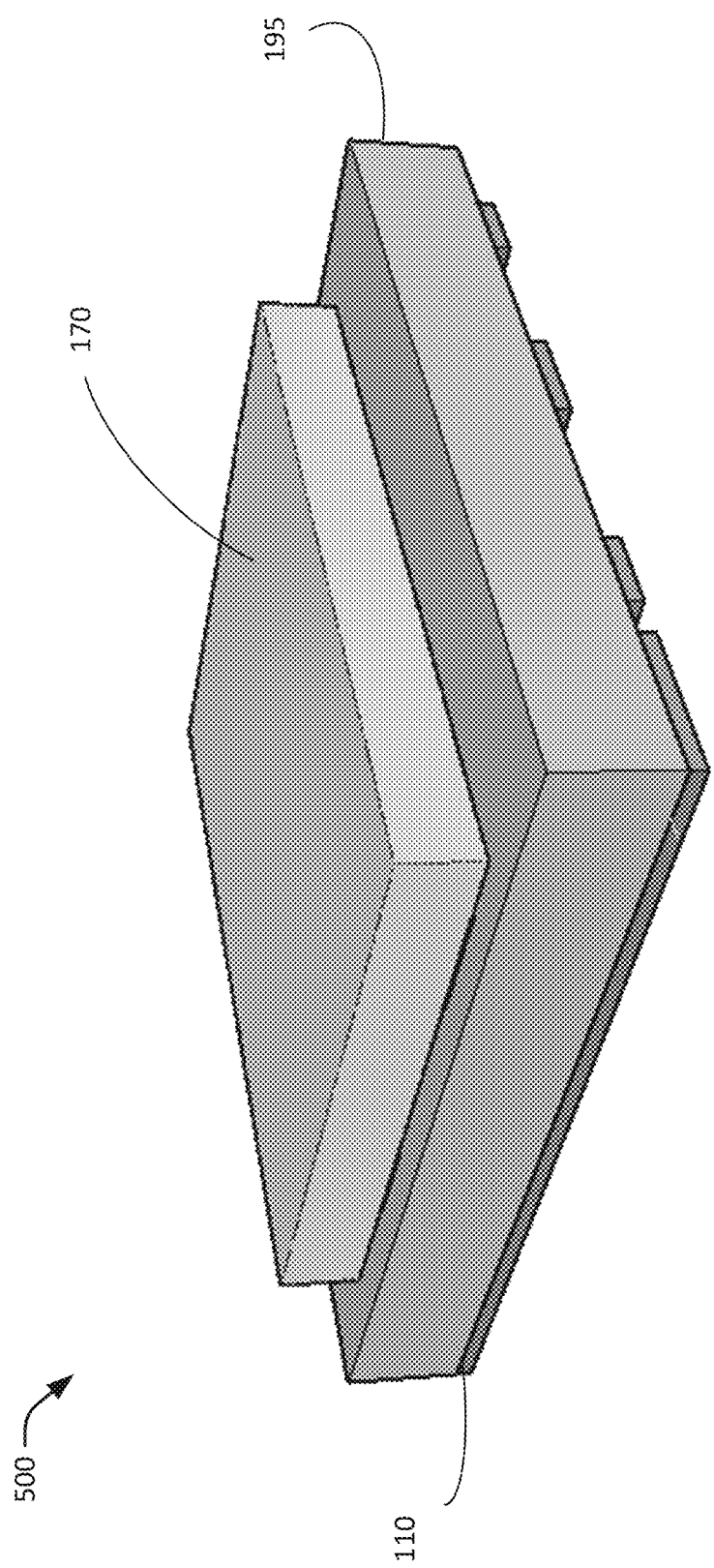

FIG. 5h shows disposing a second or top component 170 of the stack over the patterned upper gang leg portions 184. In one embodiment, the second component includes component contact pads on the bottom component surface. The bottom surface of the second component, for example, may be the active component surface with the component contact pads.

The gang legs of the gang 180 serve to connect a component contact pad disposed on the bottom component surface of the second or top component of the stack. For example, the upper gang legs are coupled to the component contact pads disposed on the bottom component surface of the second component 170 using the gang-component conductive bonding layer. The conductive bonding layers may be formed of conductive material. Preferably, the bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful. The bonding layer may be formed by employing techniques such as plating, screen printing with a stencil and/or mask, dispensing. Other techniques may also be useful.

As described, the stacked package includes one component stacked over a chip. However, it is understood that other number of components and/or chips may be stacked. For example, additional gang members may be provided to connect additional components and/or dies to the package substrate. Other configurations of a stacked package may also be useful.

Figure 6A:
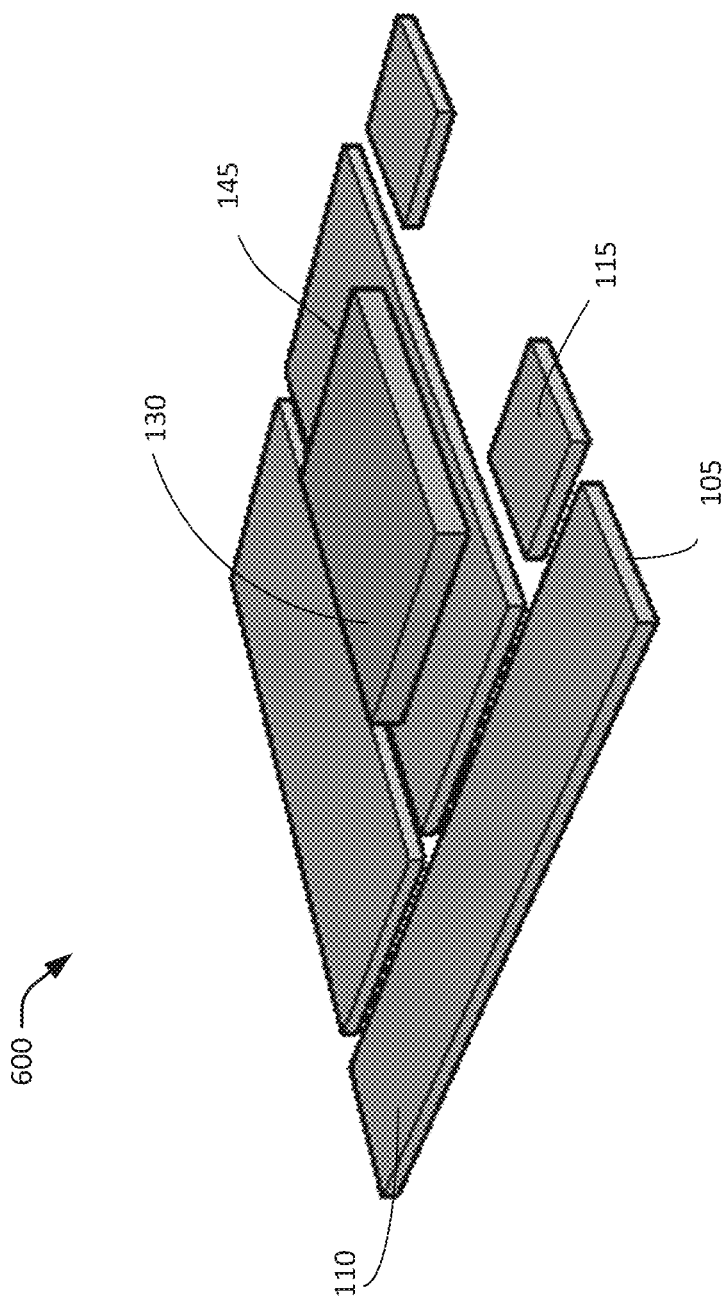

FIGS. 6a-6g show perspective views of another embodiment of a process for forming a semiconductor package 600 similar to that illustrated in FIGS. 2a-b. Common elements and features having the same reference numerals may not be described or described in detail. In the interest of brevity, the description of the process shown in FIGS. 6a-6g primarily focuses on the difference(s) compared with the process shown in FIGS. 5a-h. Referring to FIG. 6a, similar to FIG. 5a, the package substrate 110 including a lead frame configured with a plurality of terminal pads 115 is prepared and attached to an adhesive tape 105 which provides the package substrate with sufficient mechanical support for further processing steps. In one embodiment, the inactive die surface of the first die 130 is attached to the die attach region 112. For example, the die contact pad on the bottom die surface is electrically coupled to the die attach region by a conductive die-substrate bonding layer 135. In one embodiment, a clip-die bonding layer 145 is disposed over the top surface of the first die 130.

Figure 6B:
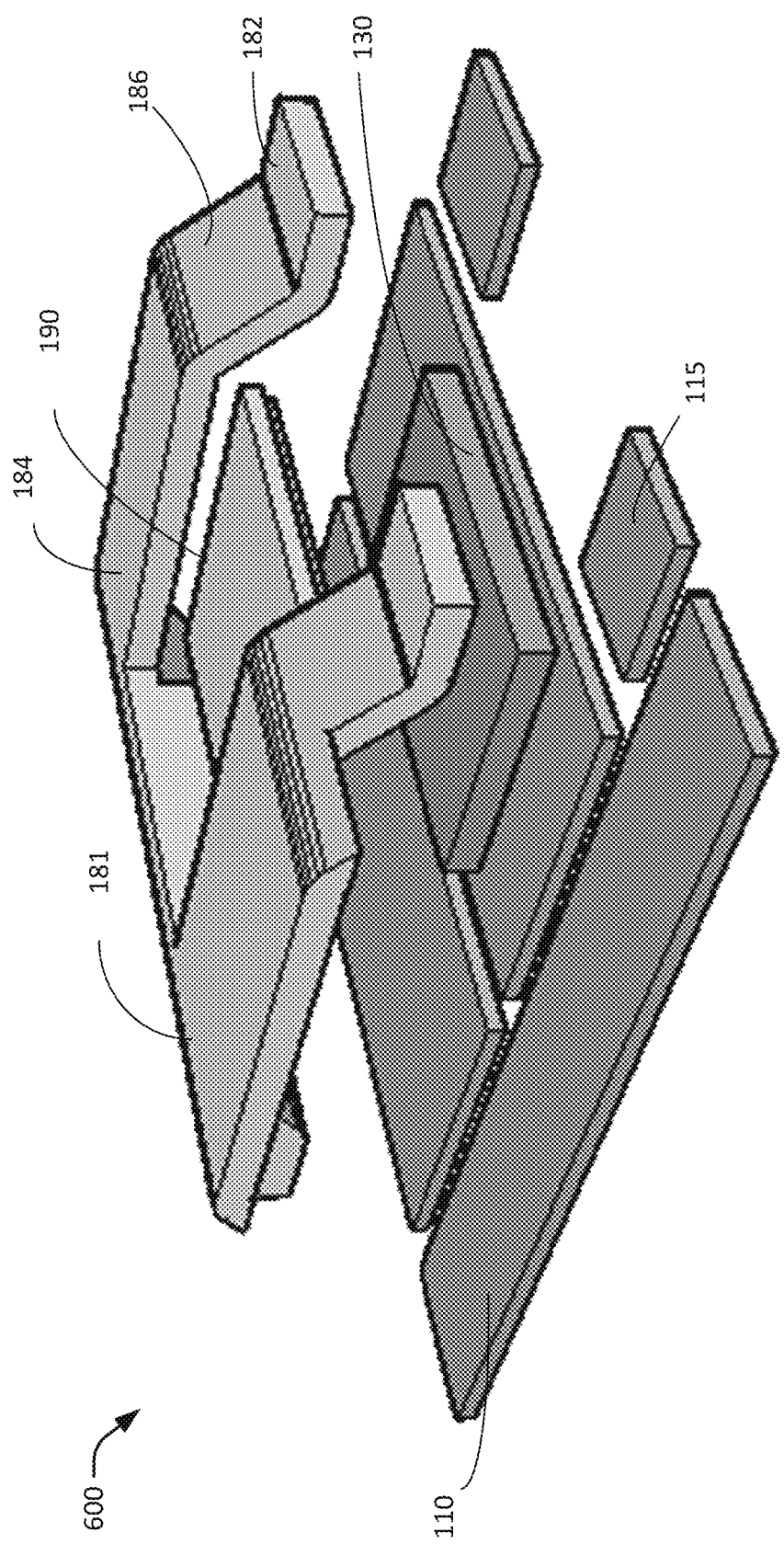

Refer now to FIG. 6b, a gang 181 is disposed over the first die 130 and package substrate 110. For example, the gang may be an integrated gang with gang legs and a clip bond 190. In some cases, depending on the number of top die contact pads on the first die, more than one clip bond may be included. The gang may be configured to include the desired number of gang legs and clip bonds based on the first die and a second component to be mounted. In one embodiment, the integrated gang is an integrated gang member which is patterned to provide the gang legs and clip bonds according to the first die and second component. Conductive bonding layers may be provided to electrically connect the die/component contact pads to the clip bond or gang legs as well as the clip bond and gang legs to terminal pads of the package substrate.

In one embodiment, the integrated gang is formed of a conductive sheet, such as a copper or copper alloy sheet. Other types of metal sheets may also be used to form the clip bond. In an alternative embodiment, the clip bond is formed from a copper or copper alloy sheet which is plated for better compatibility with a bonding layer. The plating may also serve to reduce or minimize oxidation of the clip bond. The plating material may be silver. Other materials for plating the clip bond may also be useful.

The conductive sheet may be singulated to form individual integrated gang members. For example, the conductive sheet may be patterned to form individual integrated gang members. Patterning, for example, may be achieved by stamping. Other techniques for patterning the conductive sheet to form integrated gang members may also be useful. An integrated gang member may include the desired pattern, which when bent to shape, attached to the lead frame and first die, and patterned, provides the clip bonds and gang legs for connecting the first die and second component to the package substrate.

As shown, the gang legs are provided on opposing sides of the lead frame. As for the clip bonds, it is provided on one side of the gang legs linked by a vertical linking portion 192. Providing a linking portion 192 which is slanted at an angle between the upper gang leg portion 184 and the lower gang leg portion 182 of the clip bond 190 may also be useful. Other configurations of the gang legs and clip bonds may also be useful.

Figure 6C:
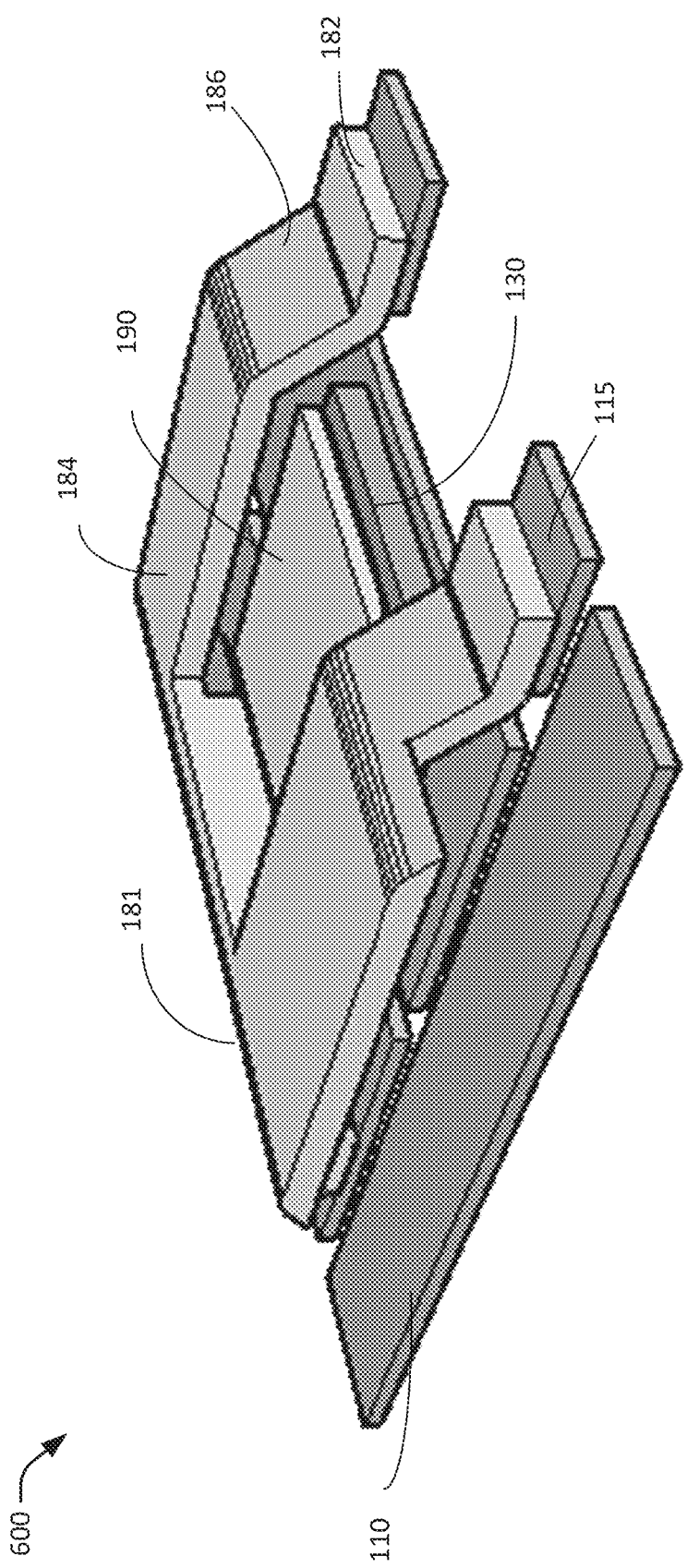

FIG. 6c shows that the integrated gang 181 is disposed over the lead frame 110 and first die 130. The conductive gang serves to electrically connect the second component subsequently disposed over the first die to the lead frame.

Figure 6D:
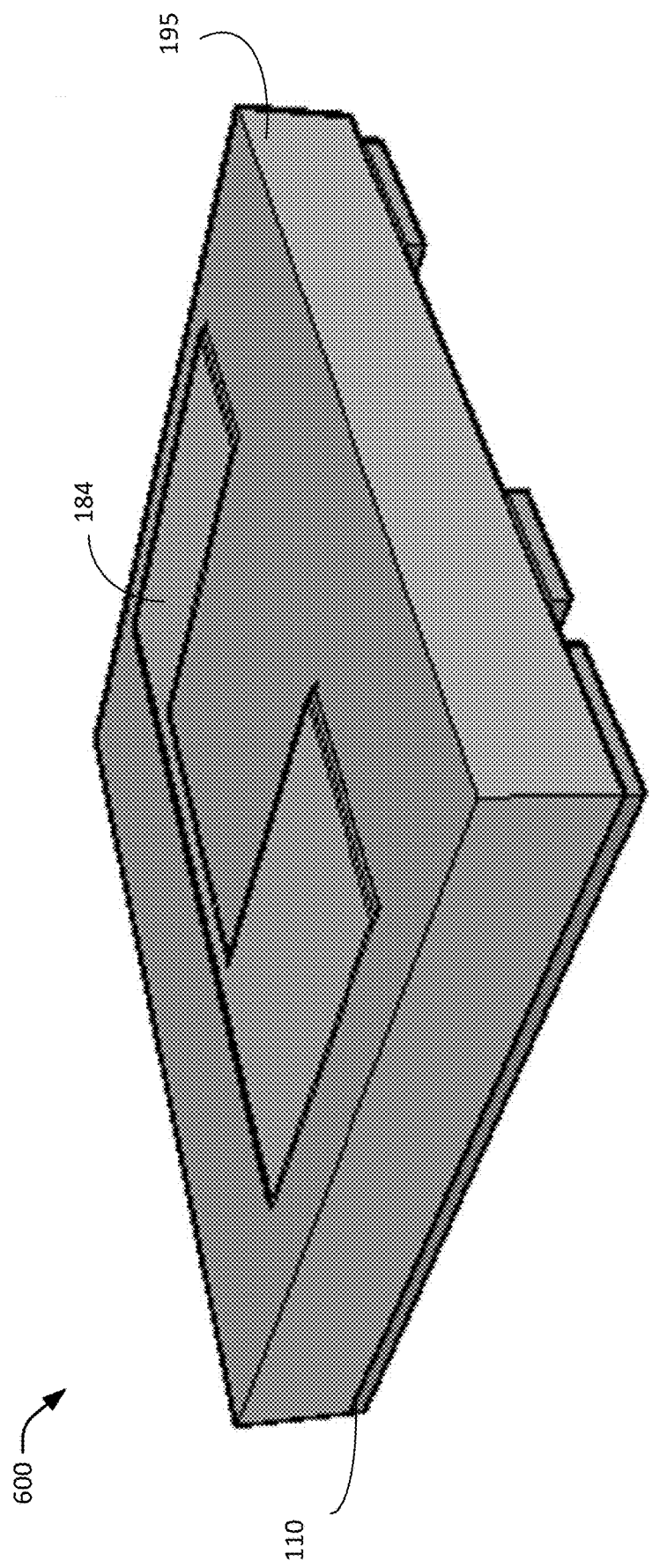

As shown in FIG. 6d, an encapsulant 195 may be disposed to cover the first die and the integrated gang 181 except the surface of the main planar gang portion. For example, the encapsulant fills the gaps in the package substrate and covers the first die and the integrated gang except the top surface of the main planar gang portion. In another embodiment, the encapsulant includes a major top surface which is disposed below the bottom surface of the main gang portion. In the case that there are wire bonds connecting die contact pads of the bottom die and terminal pads, they are also covered. After the formation of the encapsulant, the adhesive tape 105 is removed.

The encapsulant, for example, may be a mold compound. The encapsulant may be formed by, for example, transfer molding, compression molding or other techniques. Other techniques for forming the encapsulant may also be useful.

The encapsulant has the same footprint as the package substrate. This, for example, results from singulating the package substrate after completion of processing. As shown, the encapsulant includes substantially vertical sidewalls. This, for example, results from a saw singulation process. Alternatively, the encapsulant may be configured with sloped (or slanted) sidewalls. For example, the sidewalls of the encapsulant may slope downwardly from the planar top surface to the planar bottom surface. The sloped sidewalls of the encapsulant are, for example, formed by a punch singulation process. Other configurations of the encapsulant may also be useful.

Figure 6E:
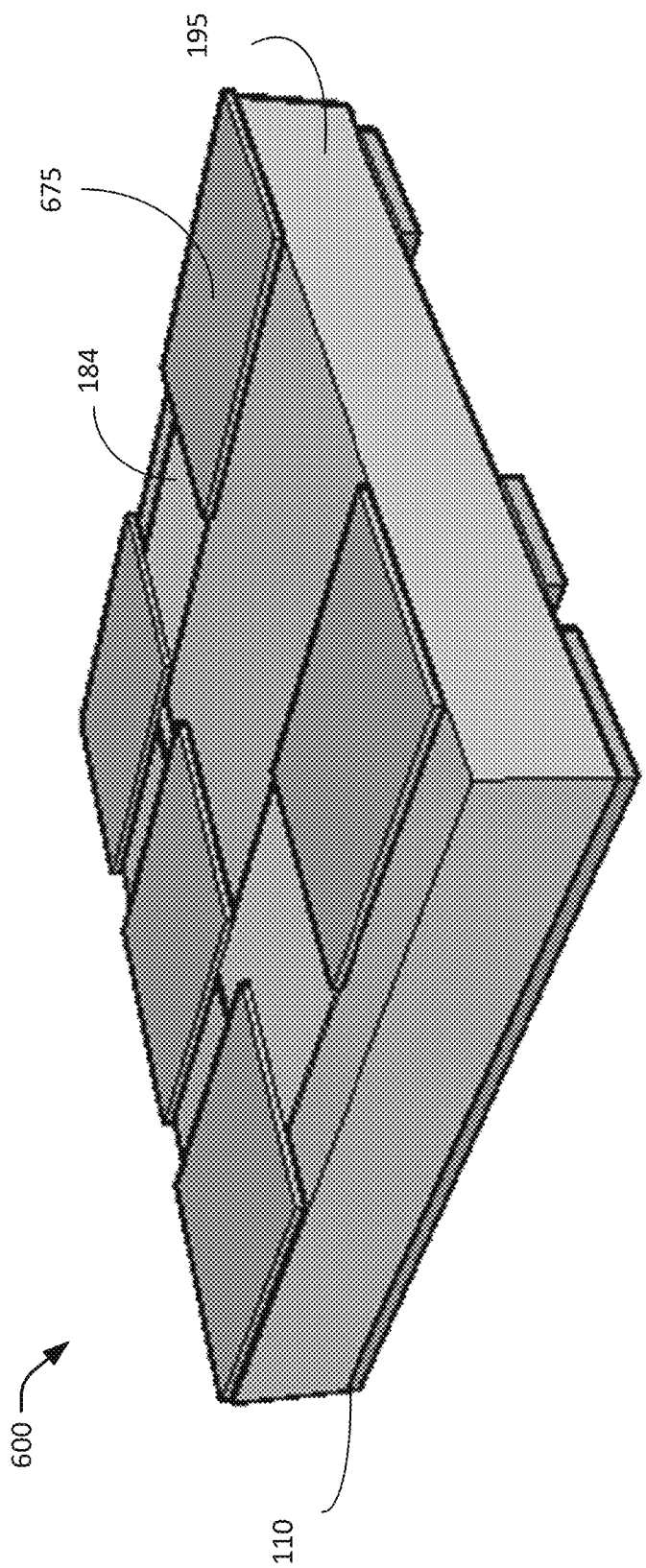

Referring to FIG. 6e, a patterned mask layer 675, such as a photoresist, may be disposed on the main planar gang portion of the gang 181. As shown in FIG. 6f, an etch process may be performed using the patterned mask layer 675 as an etch mask to remove portions of the main planar gang portion exposed by the etch mask. The etch, in one embodiment, may be an anisotropic etch such as a plasma etch. Other suitable techniques may also be employed. The etch, for example, removes portions of the main planar gang portion below the surface of the encapsulant. In one embodiment, the main planar gang portion of the gang 181 may be patterned to form upper gang leg portions 184 corresponding to patterns of die contact pads disposed on an active surface of a second component to be mounted thereover. For example, an overetch may be performed to ensure the gang leg portions are isolated from one another.

In another embodiment, as previously discussed, the encapsulant may be disposed below the bottom surface of the main gang portion. An etch using an etchant may be employed to pattern the main gang portion to form gang leg portions.

The process continues by depositing a gang-component conductive bonding layer (not shown) over the upper gang leg portions 184 of the gang 181. The gang-component bonding layer may be formed of conductive material. Preferably, the bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful. The bonding layer may be formed by employing techniques such as plating, screen printing with a stencil and/or mask, dispensing. Other techniques may also be useful.

Figure 6G:
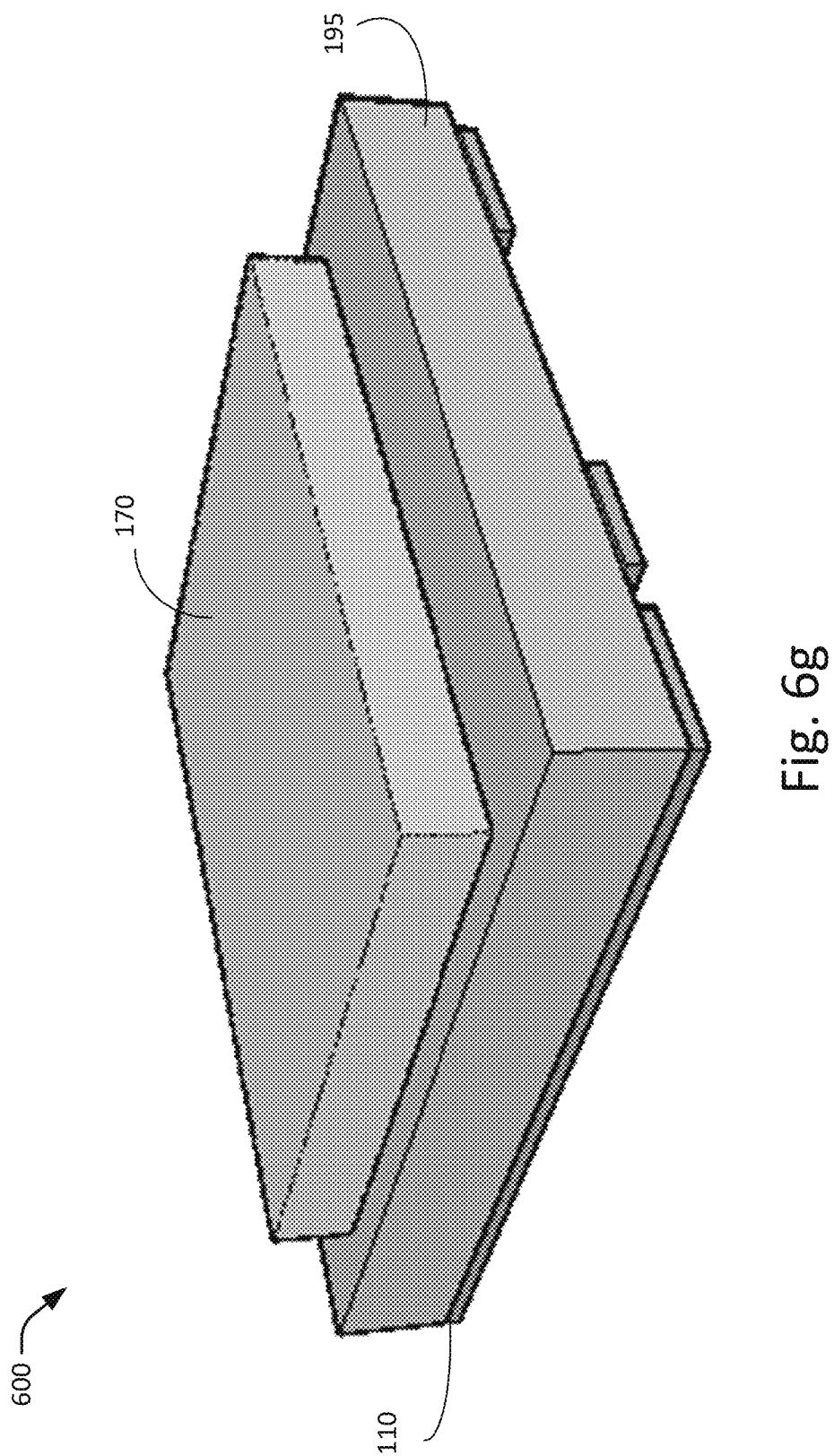

FIG. 6g shows disposing the second or top component 170 of the stack over the patterned upper gang leg portions 184. In one embodiment, the second component includes component contact pads on the bottom component surface. The bottom surface of the second component, for example, may be the active component surface with the component contact pads.

The gang legs of the gang 181 serve to connect a component contact pad disposed on the bottom component surface of the second or top component of the stack. For example, the upper gang legs are coupled to the die contact pads disposed on the bottom component surface of the second component 170 using the gang-component conductive bonding layer. The conductive bonding layers may be formed of conductive material. Preferably, the bonding layer includes a conductive material with high thermal conduction. The conductive material, for example, may include a solder paste or a sintering material. The sintering material, for example, may include a conductive sintering paste, such as copper (Cu), aluminum (Al), nickel (Ni), silver (Ag), gold (Au), alloys thereof, or combinations thereof. Other types of sintering materials may also be useful. The bonding layer may be formed by employing techniques such as plating, screen printing with a stencil and/or mask, dispensing. Other techniques may also be useful.

As described, the stacked package includes one component stacked over a chip. However, it is understood that other number of components and/or chips may be stacked. For example, additional gang members may be provided to connect additional components and/or dies to the package substrate. Other configurations of a stacked package may also be useful.

Furthermore, additional processes may be performed, such as singulating the devices to form a plurality of stacked semiconductor packages including the gang member. Other processes may also be performed.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A stacked package comprising:
a package substrate configured with a die attach region with first and second terminal pads;
a first die mounted onto the die attach region, the first die is electrically coupled to the first terminal pads;
a second component disposed over the first die; and
a conductive gang disposed between the first die and the second component, wherein the conductive gang comprises
a main planar gang portion having opposing top and bottom surfaces, wherein the bottom surface faces the first die and the top surface faces the second component, the bottom surface is disposed above a top surface of an encapsulant covering the first die, gang extensions, and
wherein the main planar gang portion and the gang extensions are configured to serve as gang legs for electrically coupling the second component to the second terminal pads of the package substrate.

2. The stacked package in claim 1 wherein the gang legs comprise lower gang legs coupled to the second terminal pads of the package substrate, wherein the second terminal pads are disposed around the die attach region of the package substrate.

3. The stacked package in claim 2 wherein the gang legs comprise upper gang legs coupled to component contact pads of the second component, wherein the component contact pads are disposed on a bottom major surface of the second component, wherein the upper and lower gang legs are linked by a riser gang leg portion.

4. The stacked package in claim 3 comprises a clip bond coupling die contact pads on a top major surface of the first die to the first terminal pads of the package substrate.

5. The stacked package in claim 4 wherein the first die and the clip bond are encapsulated by the encapsulant.

6. A stacked package comprising:
a package substrate configured with a die attach region with first and second terminal pads;
a first die mounted onto the die attach region, the first die is electrically coupled to the first terminal pads;
a second component disposed over the first die;
a conductive gang disposed between the first die and the second component, the conductive gang comprises a patterned conductive gang with gang legs, the gang legs are configured to electrically couple the second component to the second terminal pads of the package substrate, the gang legs comprise lower and upper gang legs, wherein
the lower gang legs are coupled to the second terminal pads of the package substrate, wherein the second terminal pads are disposed around the die attach region of the package substrate,
the upper gang legs are coupled to component contact pads of the second component, wherein the component contact pads are disposed on a bottom major surface of the second component, wherein the upper and lower gang legs are linked by a riser gang leg portion; and
a clip bond coupling die contact pads on a top major surface of the first die to the first terminal pads of the package substrate, wherein the gang legs are linked to the clip bond by a vertical linking portion.

7. A method for forming a device, comprising:
providing a package substrate having a die attach region;
attaching and electrically coupling a first die to the die attach region of the package substrate;
providing a conductive gang over the first die; and
stacking a second component over the conductive gang, wherein the conductive gang comprises
a main planar gang portion having opposing top and bottom surfaces, wherein the bottom surface faces the first die and the top surface faces the second component, the bottom surface is disposed above a top surface of an encapsulant covering the first die, gang extensions, and
wherein the main planar gang portion and the gang extensions are configured to serve as gang legs for electrically coupling the second component to the package substrate.

8. The method in claim 7 wherein the gang legs comprise lower gang legs coupled to terminal pads of the package substrate, wherein the terminal pads are disposed around the die attach region of the package substrate.

9. The method in claim 8 wherein the gang legs comprise upper gang legs coupled to component contact pads of the second component, wherein the component contact pads are disposed on a bottom major surface of the second component, wherein the upper and lower gang legs are linked by a riser gang leg portion.

10. The method in claim 9 comprises disposing a clip bond on a top major surface of the first die, wherein the clip bond couples the first die to the terminal pads of the package substrate.

11. The method in claim 10 wherein the encapsulant covers the first die and the clip bond.

12. The method in claim 10 wherein the clip bond is configured to have a stepped profile.

13. The method in claim 10 wherein the conductive gang is configured to have a stepped profile.

14. The method in claim 10 wherein the lower gang legs are formed by patterning opposing sides of a gang member.

15. The method in claim 10 wherein the upper gang legs are formed by patterning the main planar gang portion of the conductive gang.

16. The method in claim 7 wherein the package substrate includes an interposer.

17. The method in claim 7 wherein the first die includes a power device.

18. The method in claim 7 wherein the package substrate includes a lead frame.

19. A method for forming a device, comprising:
providing a package substrate having a die attach region;
attaching and electrically coupling a first die to the die attach region of the package substrate;
providing a conductive gang with gang legs over the first die;
stacking a second component over the conductive gang, wherein the conductive gang electrically couples the second component to the package substrate, the gang legs comprise lower and upper gang legs, wherein
  the lower gang legs are coupled to terminal pads of the package substrate, wherein the terminal pads are disposed around the die attach region of the package substrate,
  the upper gang legs are coupled to component contact pads of the second component, wherein the component contact pads are disposed on a bottom major surface of the second component, wherein the upper and lower gang legs are linked by a riser gang leg portion; and
disposing a clip bond on a top major surface of the first die, wherein the clip bond couples the first die to the terminal pads of the package substrate, wherein the gang legs are linked to the clip bond by a vertical linking portion.

* * * * *